United States Patent [19]

Hashimoto et al.

[11] Patent Number: 5,479,034
[45] Date of Patent: Dec. 26, 1995

[54] METHOD OF MAKING GATE ARRAY BASE CELL

[75] Inventors: Mashashi Hashimoto; Shivaling S. Mahant-Shetti, both of Richardson, Tex.

[73] Assignee: Texas Instruments Incorporated, Dallas, Tex.

[21] Appl. No.: 386,613

[22] Filed: Feb. 10, 1995

Related U.S. Application Data

[60] Continuation of Ser. No. 20,917, Feb. 22, 1993, abandoned, which is a division of Ser. No. 681,822, Apr. 8, 1991, Pat. No. 5,217,915.

[51] Int. Cl.$^6$ .................................................. H01L 27/02
[52] U.S. Cl. .......................... 257/213; 257/401; 257/202
[58] Field of Search .......................... 257/213, 401, 257/202

[56] References Cited

U.S. PATENT DOCUMENTS

| | | | |
|---|---|---|---|
| 4,079,505 | 3/1978 | Hirano | 437/51 |
| 4,742,019 | 5/1988 | Bechade | 437/195 |
| 4,783,692 | 11/1988 | Uratani | 357/45 |
| 5,037,771 | 8/1991 | Lipp | 437/51 |
| 5,055,716 | 10/1991 | El Gamel | 307/446 |
| 5,289,021 | 2/1994 | El Gamal | 257/206 |
| 5,331,192 | 7/1994 | Kudoh | 257/401 |

FOREIGN PATENT DOCUMENTS

| | | | |
|---|---|---|---|
| 55-163878 | 12/1980 | Japan | 257/401 |
| 2-168673 | 6/1990 | Japan . | |
| 3016174 | 1/1991 | Japan | 257/401 |

*Primary Examiner*—Mark V. Prenty
*Attorney, Agent, or Firm*—Ira S. Matsil; James C. Kesterson; Richard L. Donaldson

[57] ABSTRACT

A gate array base cell which can easily be configured as high conductivity transistor device or a low conductivity transistor device comprises a moat region of first conductivity type, typically heavily doped n-type silicon or heavily doped p-type silicon, for example. A channel region of a different conductivity type separates the moat region into at least three portions. An insulating layer, such as silicon dioxide, for example, and a gate are formed above the channel region. The gate may be formed of polysilicon, for example. Modifications, variations, circuit configurations and an illustrative fabrication method are also disclosed.

36 Claims, 26 Drawing Sheets

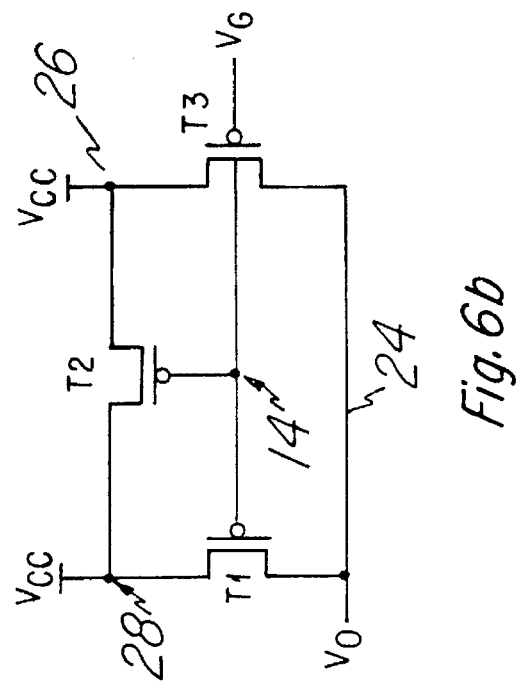
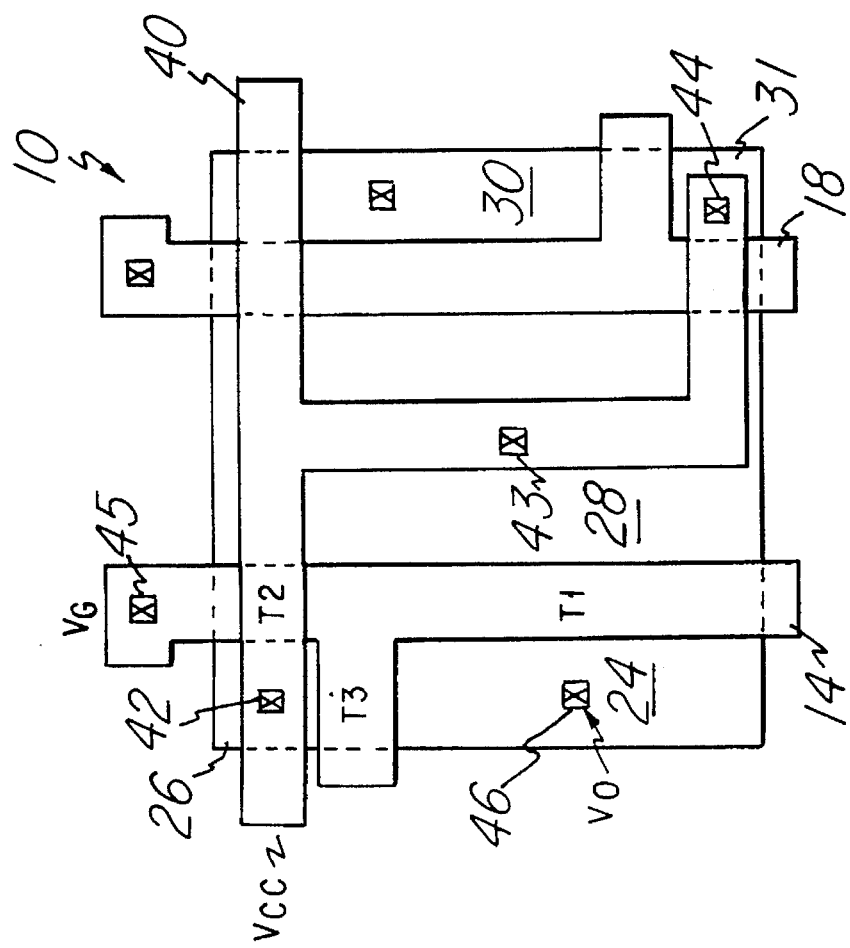
Fig. 6b
Fig. 6a

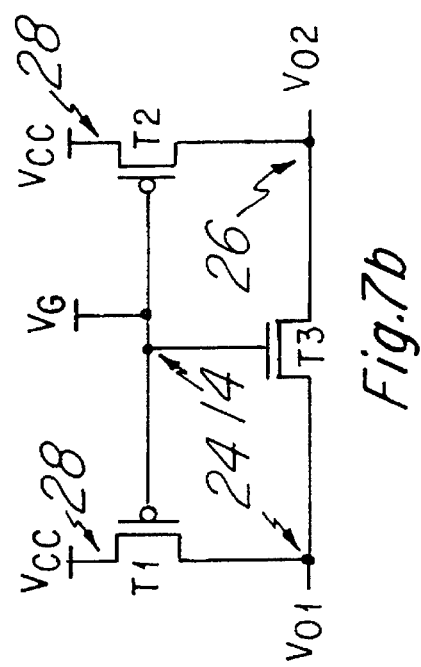
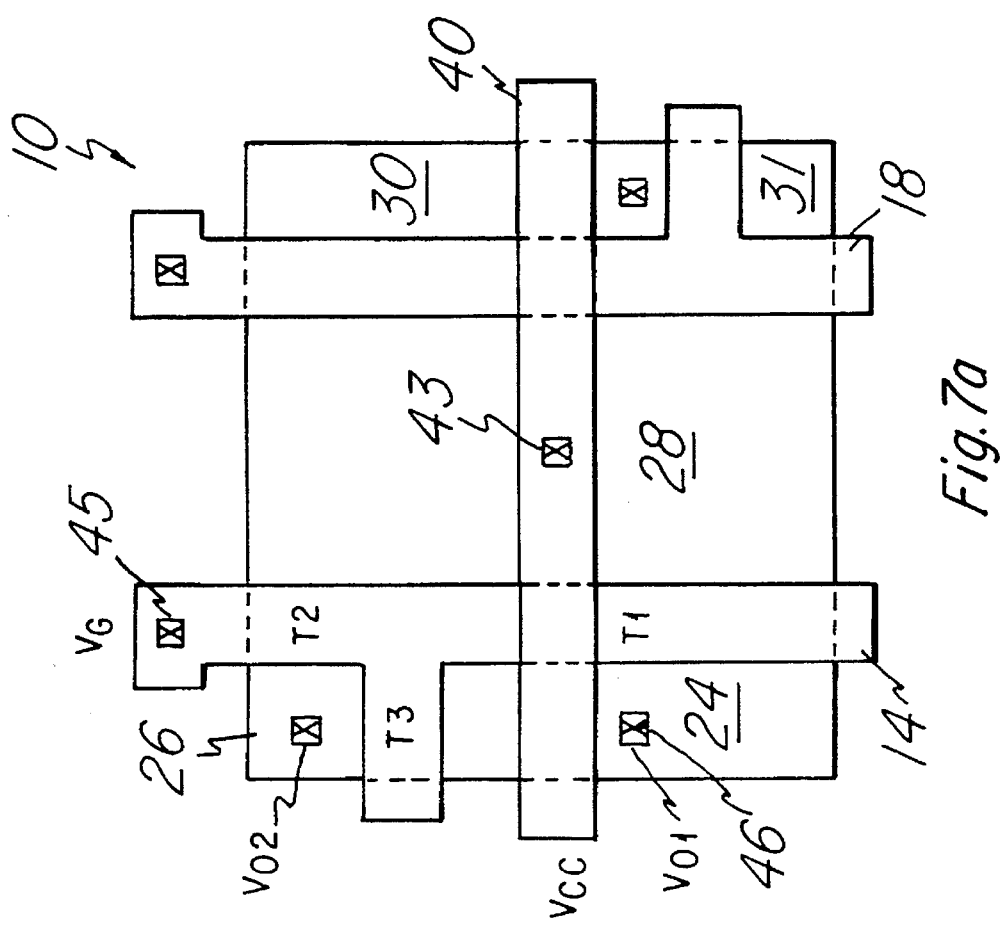

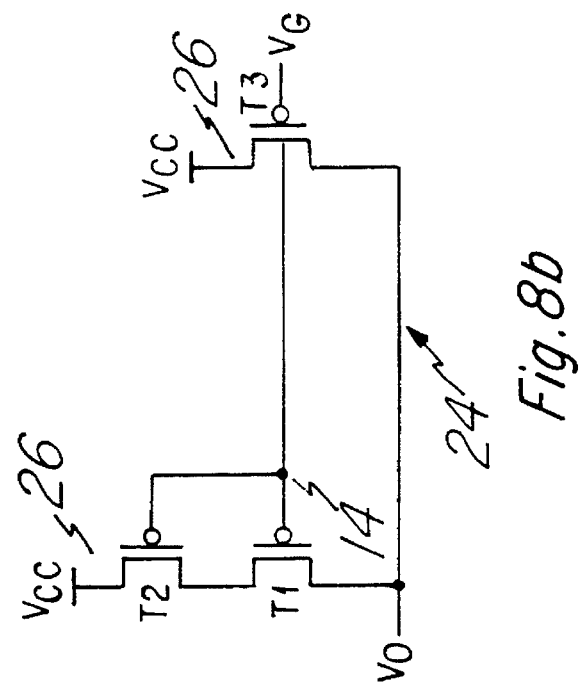
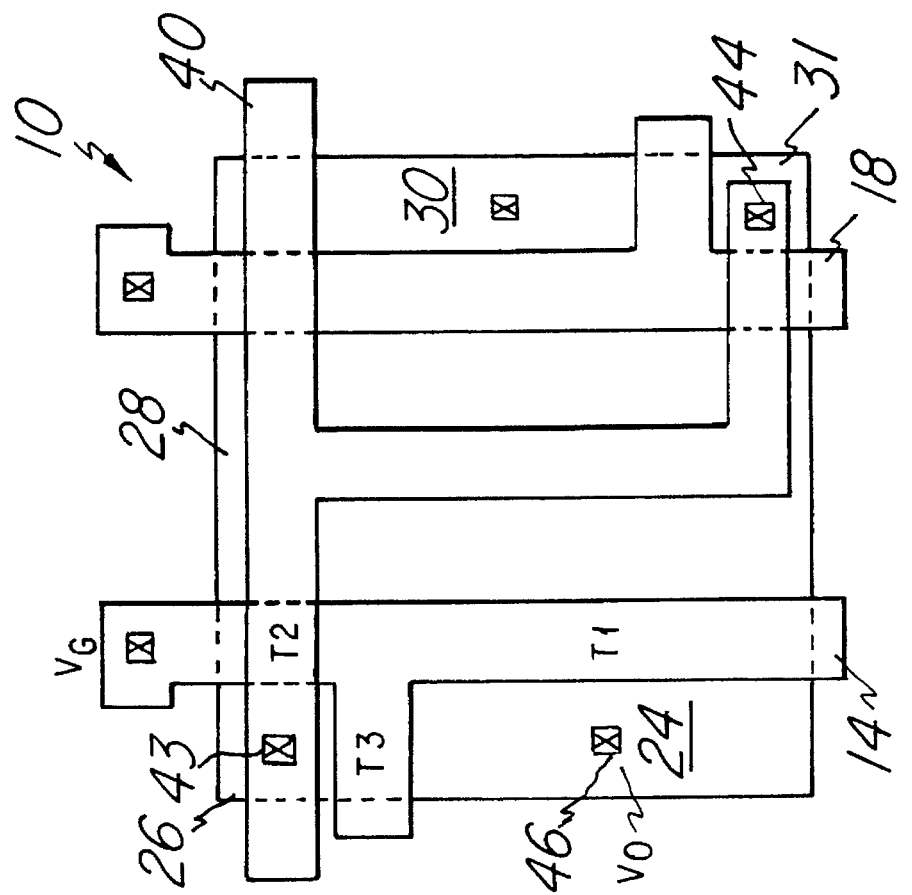

METHOD OF MAKING GATE ARRAY BASE CELL

This is a division of application Ser. No. 07/681,822, filed Apr. 8, 1991.

FIELD OF THE INVENTION

This invention generally relates to semiconductor devices and their fabrication and specifically to an improved gate array base cell structure and method for forming the same.

BACKGROUND OF THE INVENTION

In the fabrication of integrated circuits it is often necessary to form a large number of transistors on a single chip. These transistors are interconnected to form logic gates, flip-flops, memory cells and a wide variety of other devices. In most static logic, a high transistor channel conductance is desirable to accomplish high speed operation. In some circuits such as static random access memories (SRAM) for example, however, a low conductivity transistor is desirable to achieve stable write operation with a wide process margin.

One common way to accomplish the goal of having both high and low conductivity transistors on the same chip is to design the entire layout of the chip for each application. With a custom layout, transistors of different sizes can be easily implemented. The disadvantage, however, is that all the levels of the multilevel device must be designed for each particular implementation.

On the other hand, a gate array is an array of transistor circuits which utilize the same base cell for many different applications. In this configuration, only the final interconnect levels of the multilevel device are specifically designed for any given application. The initial levels, known as the base cell, are the same for each implementation. This methodology makes it more difficult than customized layouts to have transistors of different sizes since the locations of the various conductance transistors will vary from application to application.

When using gate arrays, one may build transistors of identical sizes and design the circuitry accordingly. To satisfy the requirement of gates with varying driveability, more than one transistor may be connected in a manner such that the configurations of multiple transistors will appear to have varying conductances. These methods, however, require more transistors per application than customized layouts and it in turn will require more area on the chip.

Another method for designing gate arrays is to include more than one size of transistor in the base cell pattern. In this case, the final configuration can be connected to utilize whichever size transistor is required for the current application. Once again, however, there will be many transistors which will not be used. In addition, it is desirable to avoid long connections of transistors to help enhance final speed.

Accordingly, improvements which overcome any or all of the problems are presently desirable.

SUMMARY OF THE INVENTION

Other objects and advantages will be obvious, and will in part appear hereinafter and will be accomplished by the present invention which provides a gate array base cell which has the flexibility to provide transistors of varying channel conductance.

A gate array base cell comprises a moat region of first conductivity type, typically heavily doped n-type silicon or heavily doped p-type silicon, for example. A channel region of a different conductivity type separates the moat region into at least three portions. An insulating layer, such as silicon dioxide, for example, and a gate are formed above the channel region. The gate may be formed of polysilicon, for example.

The base cell structure can be interconnected to form many circuits such as flip-flops, read only memories, static random access memories, multi-port memories, and logic gates, as examples. Transistor connections to form a variety of conductance channel devices are disclosed. An illustrative method of forming the structure is also disclosed.

An advantage of the invention is that it provides both high and low conductivity transistors with no area penalty. The base cell array allows the freedom of a variety of transistor widths without the burden of custom designing the entire circuit or the requirement of added area as is necessary when using layouts with different size base cells.

BRIEF DESCRIPTION OF THE DRAWINGS:

The above features of the present invention will more clearly understood from consideration of the following descriptions in connection with accompanying drawings in which:

FIG. 6a–6b are an interconnected top view and corresponding schematic of a high conductance transistor configuration;

FIG. 7a–7b are an interconnected top view and corresponding schematic of a high conductance transistor configuration;

FIG. 8a–8b are an interconnected top view and corresponding schematic of a low conductance transistor configuration;

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of several preferred embodiments of the structure and method of forming the present invention. The prior art will be briefly described. Several preferred embodiments of the invention will then be described followed by some examples of usage. Finally, one sample method of fabrication will be described.

Figure 1A:
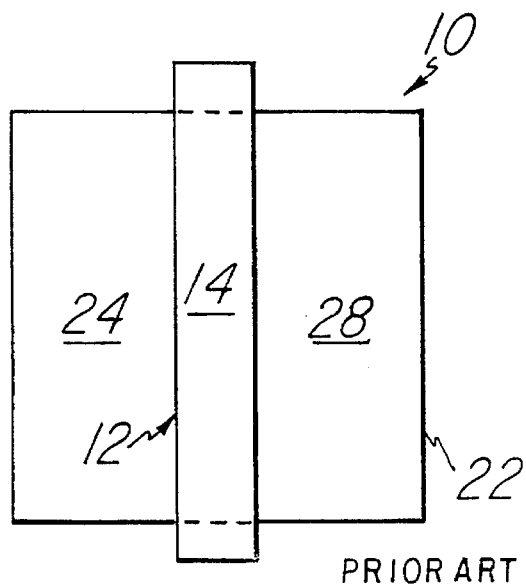
FIG. 1a–1b are top views of typical prior art base cells.

Referring first to FIG. 1a, a prior art method base cell 10 is shown. The base cell 10 comprises a moat region 22 which is separated into two regions 24 and 28 by channel region 12. Gate 14 is formed above and insulated from channel region 12. The moat region comprises n+ doped silicon for n-channel transistors or p+ doped silicon for p-channel transistors.

In the prior art shown in FIG. 1a, one transistor may be formed. Moat regions 24 and 28 comprise the source and drain of the transistor and channel region 12 comprises the channel of the transistor. As is well known in the art, the transistors may be configured into the desired circuits by connecting the gate 14 and moat regions 24 and 28 with conductive lines, not shown.

Figure 1B:
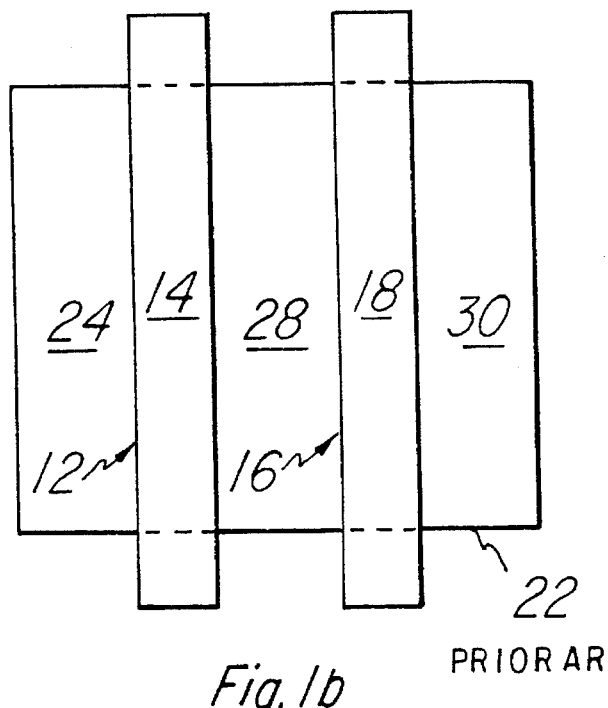

FIG. 1b shows a prior art base cell with two gates 14 and 18. The gates 14 and 18 and underlying channel regions 12 and 16 separate moat region 22 into regions 24, 28, and 30. In this base cell, two transistors may be formed. One transistor includes gate 14 and moat regions 24 and 28 as the source and drain while the other transistor includes gate 18 and moat regions 28 and 30 as the source and drain. As with the single transistor base cell, the transistors may be configured into the desired circuits with conductive interconnects, not shown.

Figure 2A:
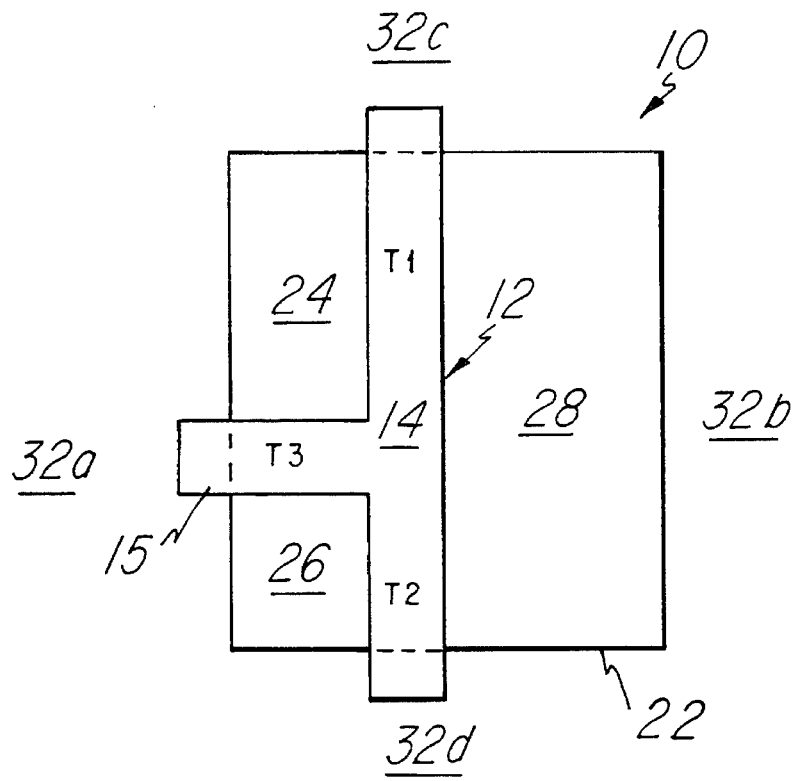
FIG. 2a–2c are top views of preferred embodiment base cells.

FIG. 2a shows a top view of a first embodiment of the gate array base cell 10 of the present invention. As shown, the base cell 10 comprises a moat region 22. The cell 10 includes a gate 14 formed above a channel region 12. Unlike prior art cells, gate 14 includes an extended portion 15 which spans across the moat 22 on one side of gate 14 and extends to the insulating region 32a which separates cell 10 from like cells in the array. The channel region 12 also extends beneath gate extension 15.

In the present embodiment, the moat region 22 is separated into three regions 24, 26, and 28. The base cell shown in FIG. 2a can be configured into three transistors. Transistor T1 comprises source region 24, drain region 28, and gate 14, transistor T2 comprises source region 26, drain region 28 and gate 14, and transistor T3 comprises source region 24, drain region 26 and gate 15. Of course, the source and drain may be reversed.

The base cell has the advantage of having a possibility of three transistors as opposed to only one in the prior art cells. In addition, all three transistors may have different channel widths and/or lengths and therefore different channel conductivities.

In typical embodiments, the moat region 22 comprises heavily doped silicon. Moat region 22 comprises n+ doped silicon for n-channel transistors and p+ doped silicon for p-channel transistors. The channel region 12 is typically, but not necessarily, lightly doped with a conductivity opposite that of the moat region. The gate 14 is formed from a conductive material, typically heavily doped polysilicon, for example. The channel region 12 and the gate 14 are separated by an insulating layer, possibly an oxide such as silicon dioxide, for example. Insulating region 32 may also be formed from a thick oxide such as silicon dioxide, for example.

Gate array base cell 10 is typically one cell in an array which may include up to 300,000 to 500,000 cells or more. The transistors in each cell are interconnected with conductive interconnects, not shown, which are formed above an insulating layer, not shown, which extends over the entire array. Contact holes are formed through the insulating layer so the conductive interconnects can contact the desired portion of the transistor cell.

Figure 2B:
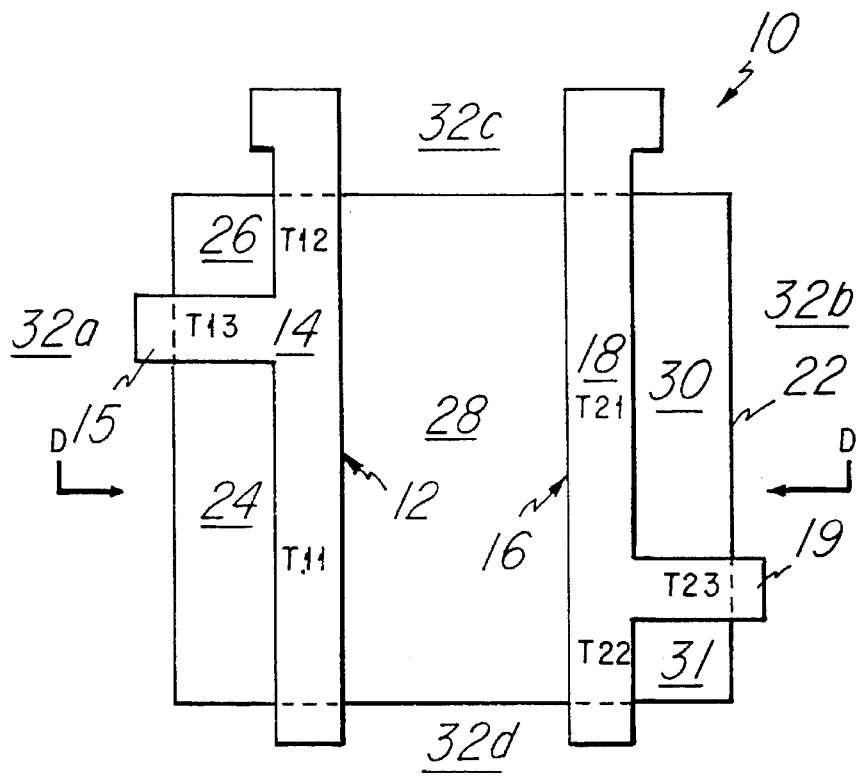

Referring now to FIG. 2b, a two gate embodiment of the present invention is shown. The base cell 10 includes two gates 14 and 18 which overlie channel regions 12 and 16, respectively. The gate 14 includes gate extension 15 which spans across the moat 22 on one side of gate 14 and extends to the insulating region 32a. Likewise, the gate 18 includes gate extension 19 which spans across the moat 22 on the side of gate 18 opposite of gate 14 to insulating region 32b. The channel regions 12 and 16 extend beneath the entire gate 14 and 18 including gate extensions 15 and 19. As described above with respect to FIG. 2a, the gate 14 may be used for three transistors T11, T12, and T13. Likewise, gate 18 may be shared by three transistors T21, T22, and T23. In the dual gate base cell 10, moat region 28 will be common to both gates.

Figure 2C:
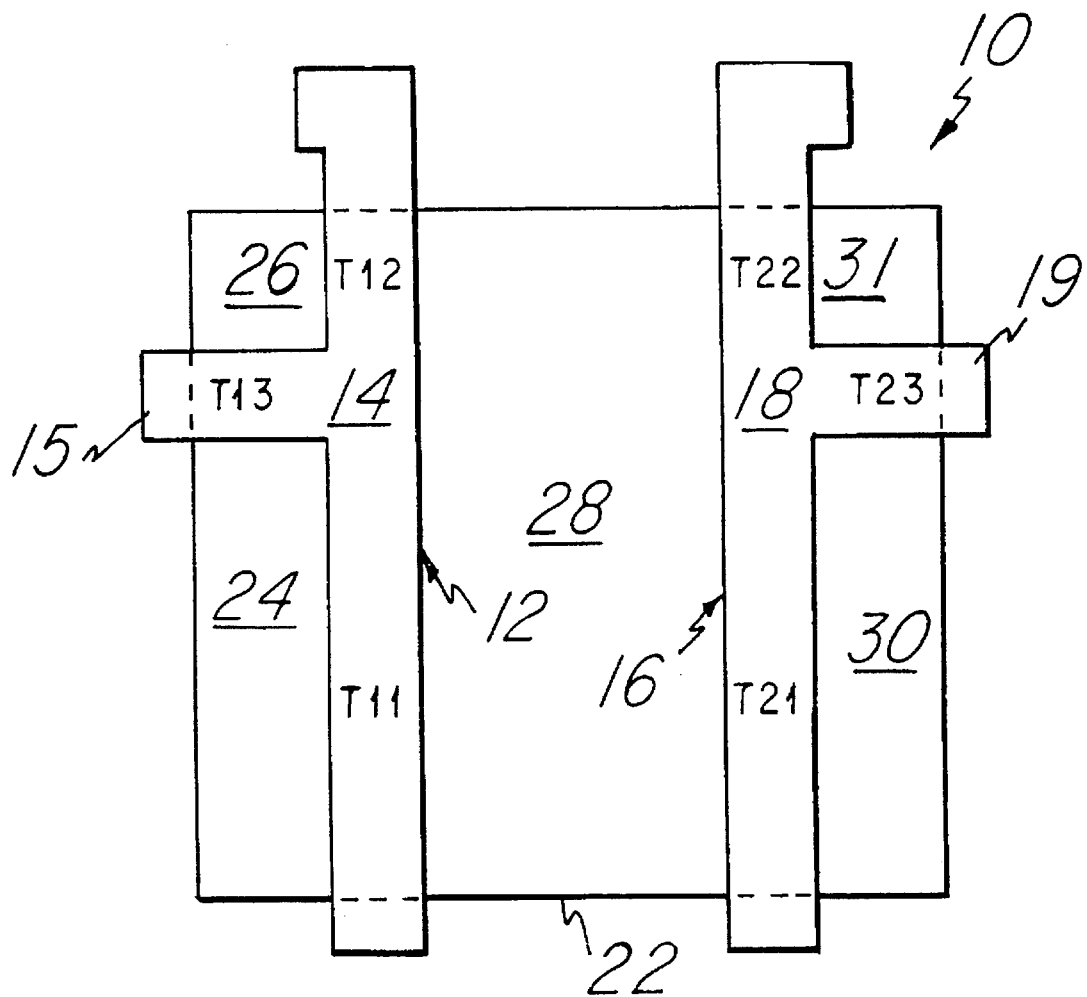

In FIG. 2b the gate extension 15 is formed on one end of gate 14 while the gate extension 19 is formed on the opposite end of gate 18. The placement of the gate extensions is based upon design choice and is typically chosen to optimize the interconnection between transistors, not shown. FIG. 2c illustrates another embodiment of the dual transistor base cell 10. In this embodiment, the gate extensions 15 and 19 are formed on the same end of the respective gates 14 and 18. Although, the placement of gate extensions 14 and 18 maintain some kind of symmetry in both FIG. 2b and FIG. 2c, this is not a necessary condition.

Figure 3A:
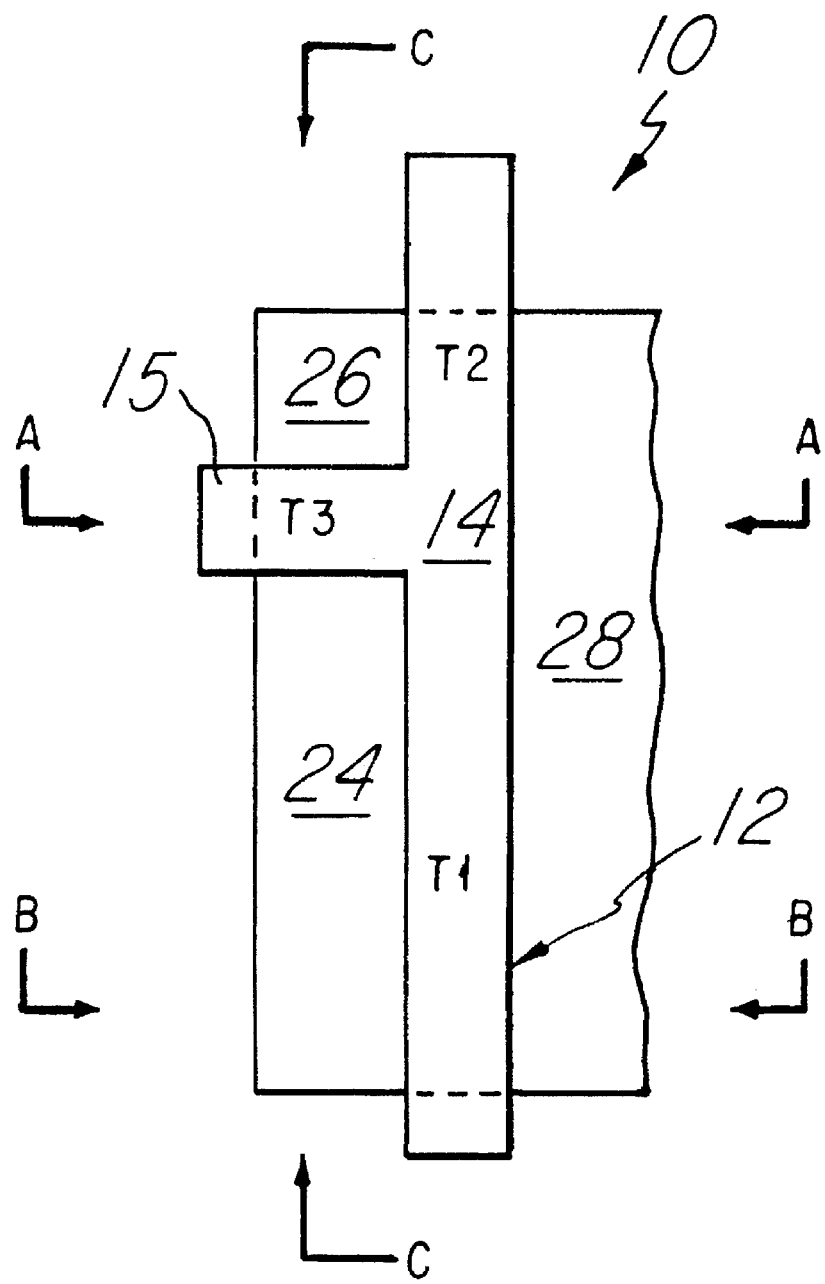
FIG. 3a–3d illustrate cross-sectional views of a preferred embodiment.
Figure 3B:
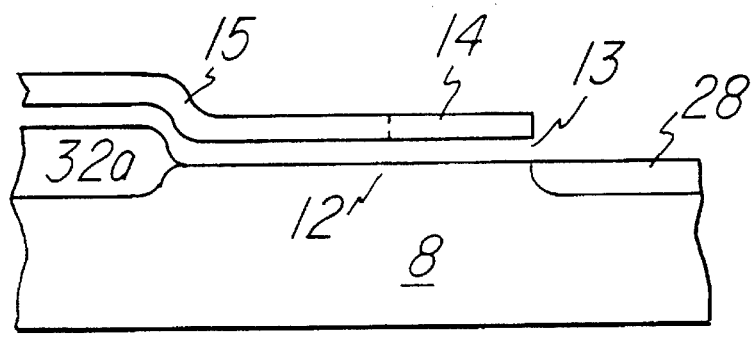
Figure 3C:
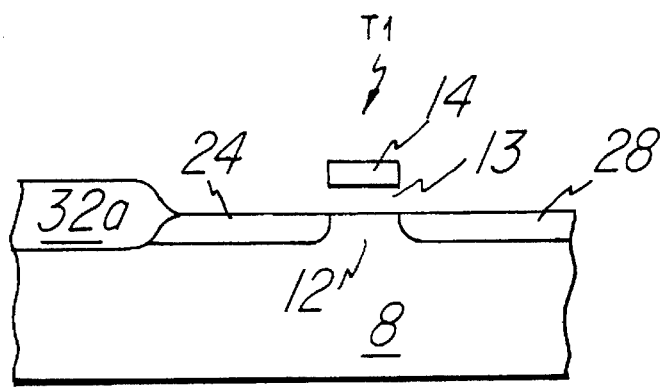
Figure 3D:
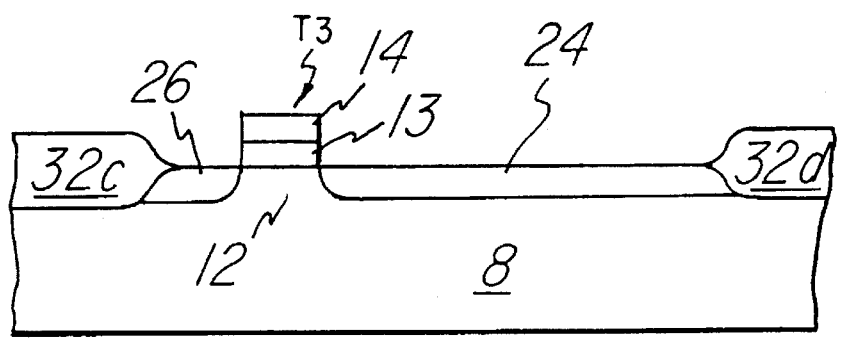

FIG. 3a illustrates a ton view of the base cell 10 and cross sectional views of base cell 10 are shown in FIGS. 3b through FIG. 3d.

FIG. 3a illustrates a top view of the base cell 10 as described above with respect to FIG. 2a. FIG. 3b illustrates a cross-sectional view along the line AA of FIG. 3a. Gate 14 and gate extension 15 are formed above channel region 12 and insulated therefrom by insulating layer 13. The gate 14 and gate extension 15 extend from moat region 28 to insulating region 32a. The gate 14 may be self-aligned with moat region 28, for example.

FIG. 3c illustrates a cross-sectional view along the line BB of FIG. 3a. Gate 14 is formed above channel region 12 and insulated therefrom by insulating layer 13. The channel region 12 separates moat region 24 from moat region 28. The gate 14 may be self-aligned with moat regions 24 and 28, for example. The transistor T1 is created by using moat region 24 as the source and moat region 28 as the drain, or vice versa. Insulating region 32a is illustrated adjacent to moat region 24 to isolate the base cell 10 from adjacent cells in the array. An insulating region may also be formed adjacent to moat region 28, as illustrated in top view in FIG. 2a, or another channel region 16 and gate 18 my be formed adjacent to moat region 28, as illustrated in top view in FIG. 2b and FIG. 2c.

FIG. 3d illustrates a cross-sectional view along the line CC of FIG. 3a. Gate 14 is formed above channel region 12 and insulated therefrom by insulating layer 13. The channel region 12 separates moat region 24 from moat region 26 to from transistor T3. The gate 14 may be self-aligned with moat regions 24 and 26, for example. Insulating regions 32c and 32d isolate the base cell 10 from adjacent base cells and abut moat regions 26 and 24, respectively.

Figure 4:
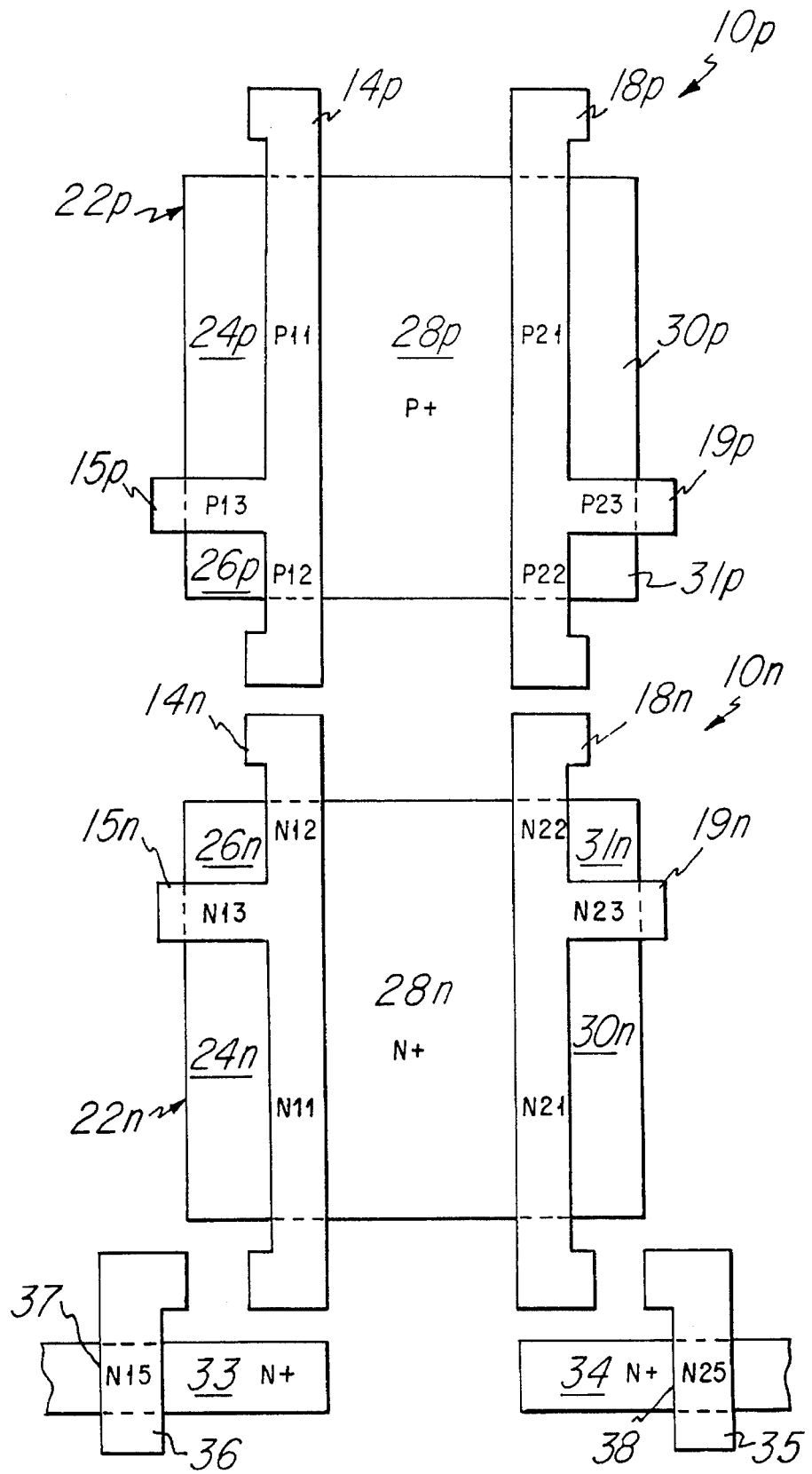
FIG. 4 is a top view of a CMOS embodiment base cell.

Many variations are achievable with the present base cell layout. In FIG. 4, a base cell 10p and base cell 10n are formed adjacent to each other. In the cell illustrated, moat region 22p is formed from p+ doped silicon and is used to form p-channel transistors. Moat region 22n is formed from n+ doped silicon and is used to form n-channel transistors. This configuration may be used when the desired gate array is going to utilize CMOS (Complementary Metal Oxide Semiconductor) transistors. Of course, the locations of the moat regions may be reversed. In a typical embodiment, alternating rows n-channel and p-channel base cells will be formed with each row having moat regions of the same conductivity type.

Also shown in FIG. 4 are small moat regions 33 and 34. The small moat region 33 is separated by a gate region 36 and underlying channel region 37 to form transistor N15. Similarly, the small moat region 34 is separated by a gate region 35 and underlying channel region 38 to form transistor N25. Transistors N15 and N25 may be used for a pass gate of a memory cell, for example. Although illustrated as n-channel devices, the transistors N15 and N25 may be p-channel devices.

Figure 5:
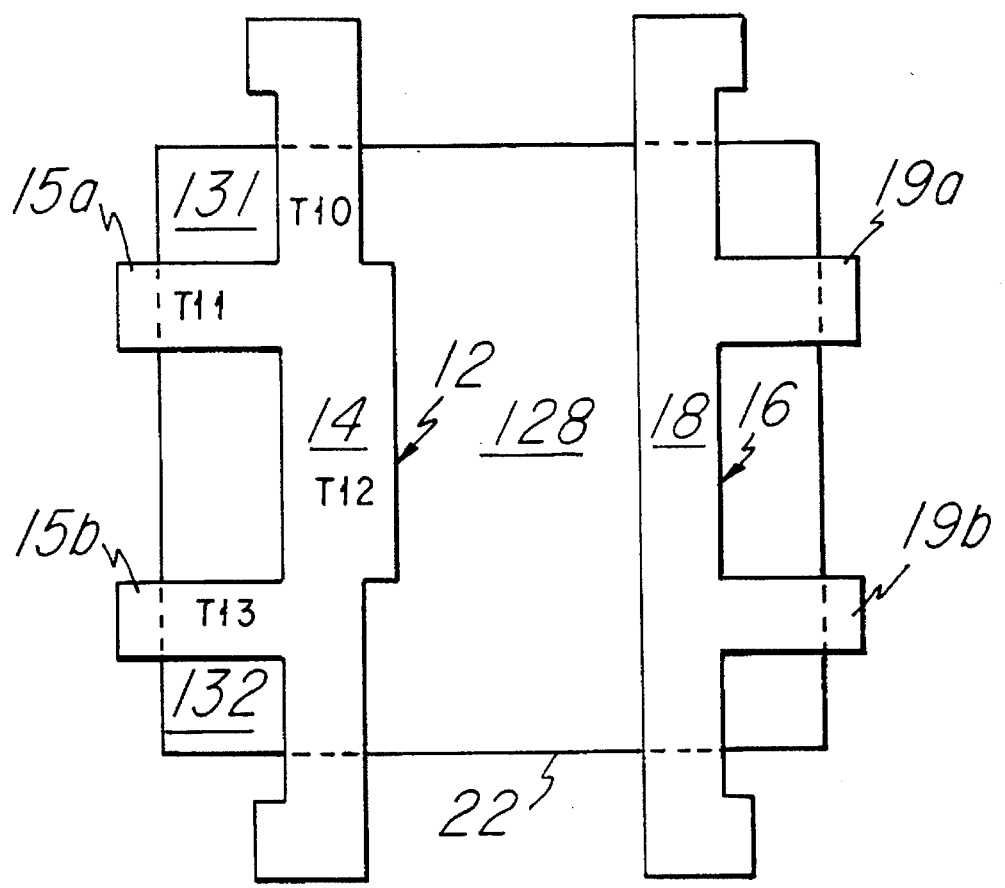
FIG. 5 is a top view of an alternate embodiment base cell.

Several variation upon base cell 10 are shown in FIG. 5. In this embodiment, the gate 14 includes gate extension 15a as well as gate extension 15b. As with the previously described embodiments, the channel region 12 extends beneath the entire gate including gate extensions 15a and 15b. Here the moat region 22 is separated into four portions by channel region 12 and overlying gate 14 and gate extensions 15a and 15b. In this configuration, five transistors T10 through T14 may be formed. This configuration provides the advantage of more transistors in the small area but has the disadvantage of increased layout overhead. It is desirable for region 131 and region 132 to be at the same potential to get the highest channel conductivity and therefore an interconnect must connect them. In FIG. 5, the transistor T12 is wider than transistors T10 and T14 illustrating another possible modification.

Also shown in FIG. 5, is gate 18 with gate extensions 19a and 19b. This configuration is shown to illustrate a gate layout which is not symmetric. It is also possible to include more than two gates in a single base cell, although not shown. One or all these modifications, as well as the many other variations that are obvious to one skilled in the art, may be implemented in any of the embodiments illustrated herein.

Three transistor configurations are shown in FIGS. 6 through 8. The choice of the connection is made based upon the circuit requirement. Unlike prior art multiple moat configurations, no extra area is required to implement the structures shown in FIGS. 6 through 8.

The schematic configuration shown in FIG. 6a is a good choice for high speed logic. Referring to FIG. 6a along with FIG. 6b, each transistor T1, T2, and T3 shares a common gate 14. Moat region 24 serves as the drain for transistors T1 and T3. Moat region 28 is the drain for transistor T2 and the source for transistor T1 and moat region 26 is the source for transistors T2 and T3. The transistors are schematically shown as p-channel devices but may be formed as n-channel devices just the same.

The layout of FIG. 6a, includes interconnect line 40 which is formed above an insulating layer which covers the entire surface of base cell 10. Connections are made from interconnect 40 to moat region 26 through contact 42 and from interconnect 40 to moat region 28 through contact 43.

In the connection shown, a voltage Vcc is applied to these nodes 26 and 28 which are connected through interconnect 40. The moat region 31 is also connected to interconnect 40 through contact 44 for the purpose of providing the symmetrical transistor configuration. The gate voltage Vg is connected to gate 14 through contact point 45. Gate 18 may be connected to another line depending upon the circuit application. Moat region 24 is a common drain for both transistor T1 and transistor T3 and coupled to voltage Vo through contact 46.

The gate extension 15 may be narrow enough to be able to fit a space between one contact and an adjacent one which are placed by restricting a minimum metal grid line. The same gate conductivity as the prior art straight gate is achieved in the embodiment shown in FIG. 6b. Even if for some reason, the extra contact is not placed at 26, the common node of T2 and T3, the gate performance loss is negligible since the main transistor T1 is quite large compared with the others.

FIG. 7a illustrates the layout and FIG. 7b the schematic of another high conductance transistor configuration for the cell of the present invention. Once again, each transistor T1, T2, and T3 shares a common gate 14. Moat region 28 serves as the source for transistors T1 and T2. Moat region 26 is the source for transistor T3 and the drain for transistor T2 and moat region 24 is the drain for transistors T1 and T3. As an example, the Vcc power supply voltage may typically be applied at region 28 and the output voltage read at either region 24 ($V_{o1}$) or region 26 ($V_{o2}$). The regions 24 and 26 will have the same DC potential but may vary in certain AC applications and therefore may be treated as independent outputs. The transistors are schematically shown as p-channel devices but may be formed as n-channel devices just the The schematic configuration shown in FIG. 8b shows a transistor configuration which provides a low gate conductance. A corresponding top view layout is shown in FIG. 8a. Once again, each transistor T1, T2, and T3 shares a common gate 14. Moat region 24 serves as the drain for transistors T1 and T3. Moat region 28 is the drain for transistor T2 and the source for transistor T1 and moat region 26 is the source for transistors T2 and T3. In this configuration, small channel width transistors T2 and T3 will dominate over the larger transistor T1 and therefore a low conductance gate will be provided. As an example, the Vcc power supply voltage may typically be applied at region 24 and the output voltage read at 26. The transistors are schematically shown as p-channel devices but may be formed as n-channel devices just the same.

As illustrated in the figures described above, the conductivity of the transistor channel configuration may be controlled by determining the connections of the transistors with varying channel widths relative to the source/drain. It should be noted that although the schematic diagrams of FIGS. 6–8 each illustrate three transistors, each diagram may be thought of as one transistor with a given conductivity where the conductivity is determined by the placement of the contacts. In other words, although the schematic diagrams appear more complicated than prior art transistors but really are no more costly, but much more flexible, in terms of design and fabrication.

The transistors configurations described above may be connected to form a large number of different device types. Some of the circuits which may be built include logic gates, flip-flops, SRAM (Static Random Access Memories), ROMs (Read Only Memories), and multi-port memories as examples. The following is a description of a few of the circuits which may be built. The following list should not be construed as being exhaustive, as the inventive concepts of the present invention may be applied to a wide variety of other circuits.

Referring next to FIG. 9, the connections necessary for a NAND gate are included. This embodiment is intended to be exemplary of the large number of logic gate which may be formed.

Figure 9A:
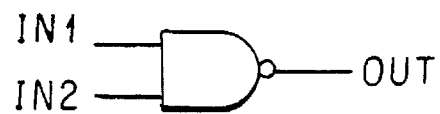
FIG. 9a–9c is a block, schematic, and layout of a NAND gate.

FIG. 9a illustrates the functional block diagram for a NAND gate with inputs IN1 and IN2 and output OUT. The schematic diagram and corresponding layout are shown in FIG. 9b and FIG. 9c, respectively.

Figure 9B:
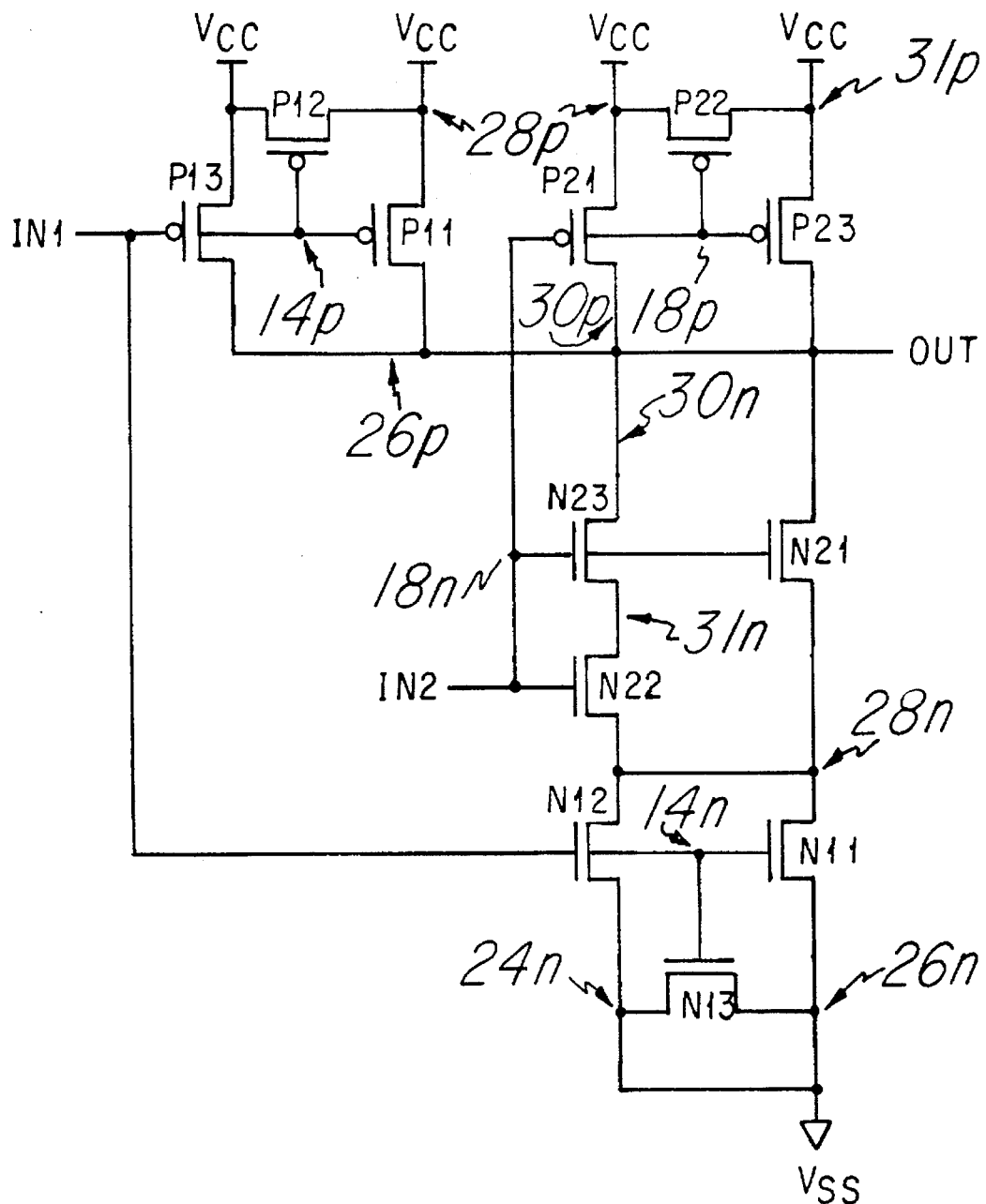
Figure 9C:
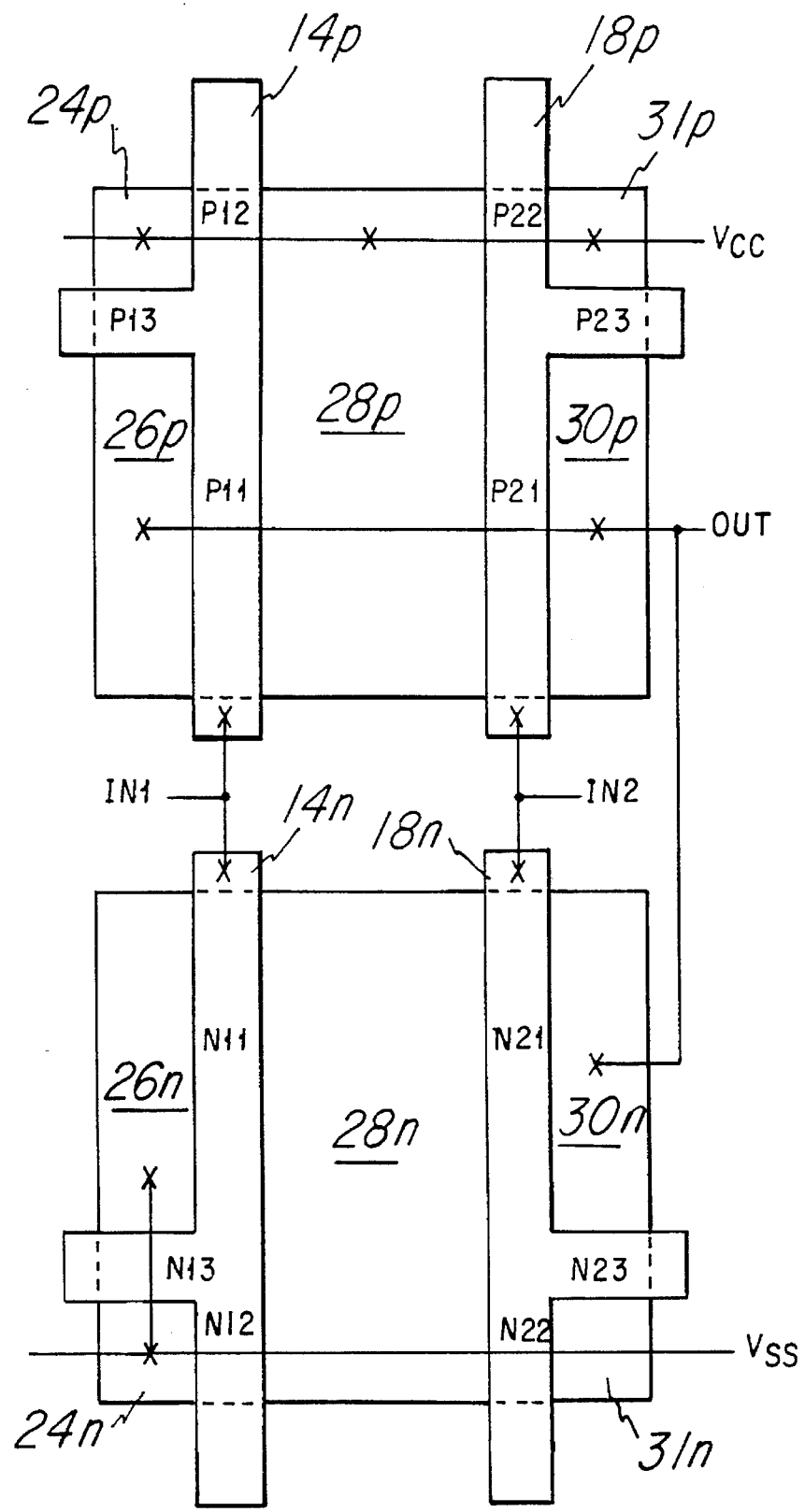

Referring to FIG. 9b along with FIG. 9c, power supply voltage Vcc is applied to regions 24p, 28p, and 31p of the CMOS gate array structure, such as the one discussed with reference to FIG. 4. The output OUT is taken from interconnected nodes 26p, 30p, and 30n. Gates 14p and 14n are electrically connected and coupled to input signal IN1. Likewise, gates 18p and 18n are connected and coupled to input signal IN2. Power supply voltage Vss, which may be ground for example, is connected to regions 24n and 26n. All interconnections may be formed from any of a large member of local interconnect techniques which are well known in the art.

Figure 10A:
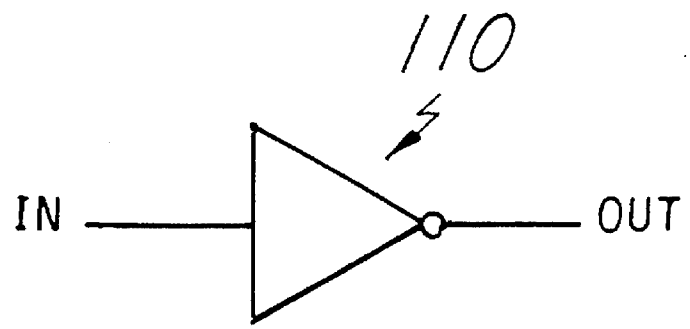
FIG. 10a–10c is a block, schematic, and layout of an inverter.

The next logic gate to be illustrated is an inverter 110 shown in functional block form in FIG. 10a. The inverter 110 has an input signal IN and an output signal OUT. The schematic diagram and corresponding layout are shown in FIG. 10b and FIG. 10c, respectively.

Figure 10B:
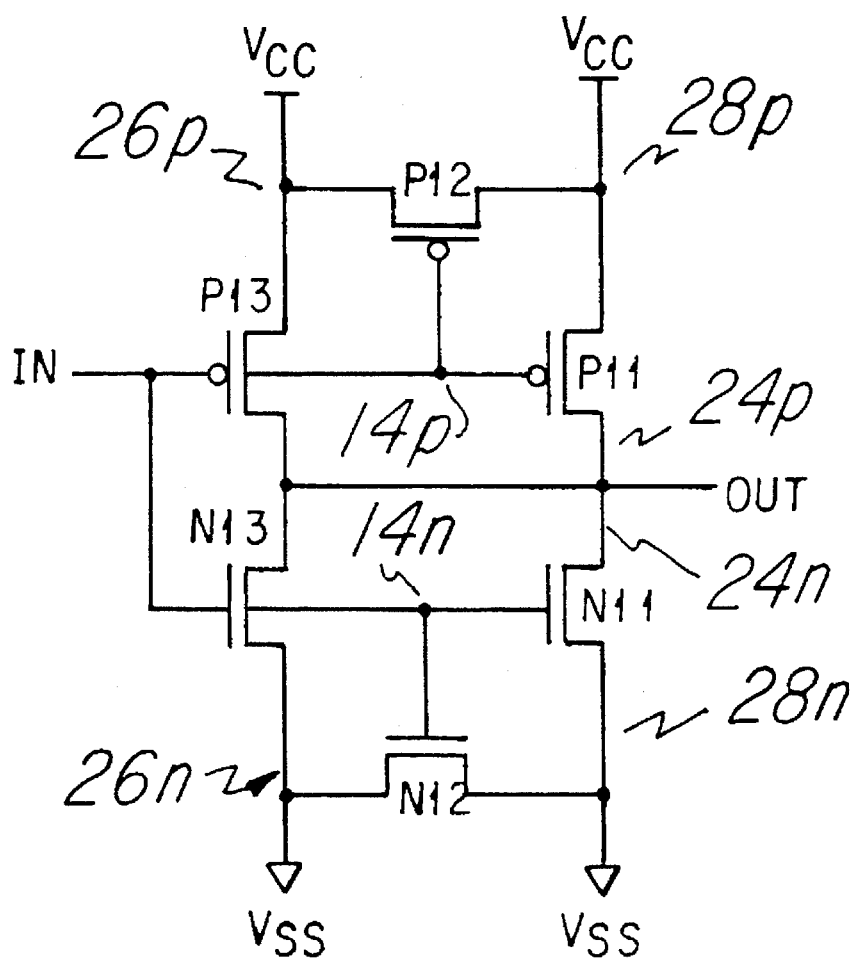
Figure 10C:
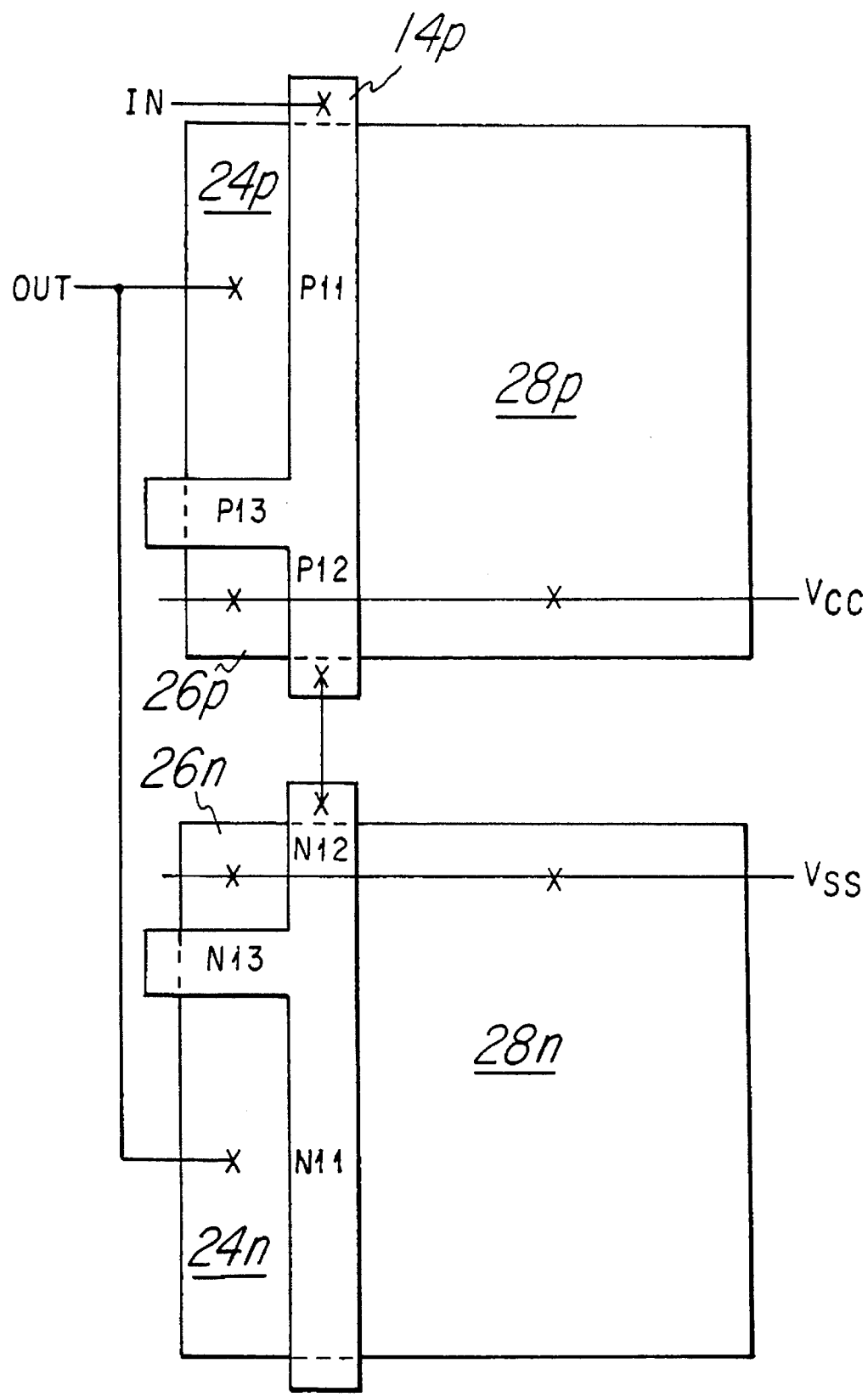

Referring to FIG. 10b along with FIG. 10c, the device utilizes a CMOS base cell such as the one described with reference to FIG. 4. Power supply voltage Vcc is applied to regions 26p and 28p and power supply voltage Vss, which may be ground for example is connected to regions 26n and 28n. The gates 14p and 14n are electrically connected to each other and coupled to the input IN. The output OUT is read at regions 24p and 24n, which are interconnected to each other. Once again, all interconnections may be formed from any of a large number of local interconnect techniques which are well known in the art.

The inverter 110 shown in FIG. 10 utilizes a high conductance transistor configuration such as the one illustrated in FIG. 6. The capability to configure devices with variable conductivities is a significant advantage over the prior art.

Figure 11A:
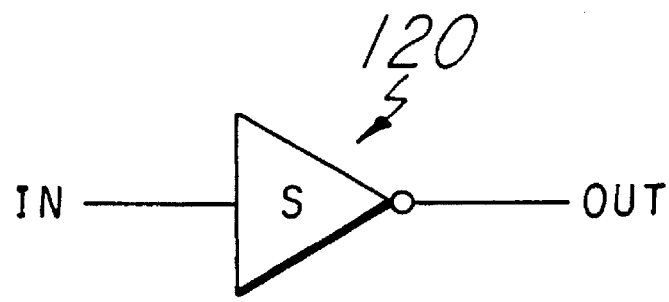
FIG. 11a–11c is a block, schematic, and layout of a small inverter.

The next logic gate to be illustrated is an inverter 120 shown in functional block form in FIG. 11a. The inverter 120 is distinguished from inverter 110 of FIG. 10 by putting an S in the functional block since the inverter utilizes the lower conductivity transistors. The inverter 120 also has an input signal IN and an output signal OUT. The schematic diagram and corresponding layout are shown in FIG. 11b and FIG. 11c, respectively.

Figure 11B:
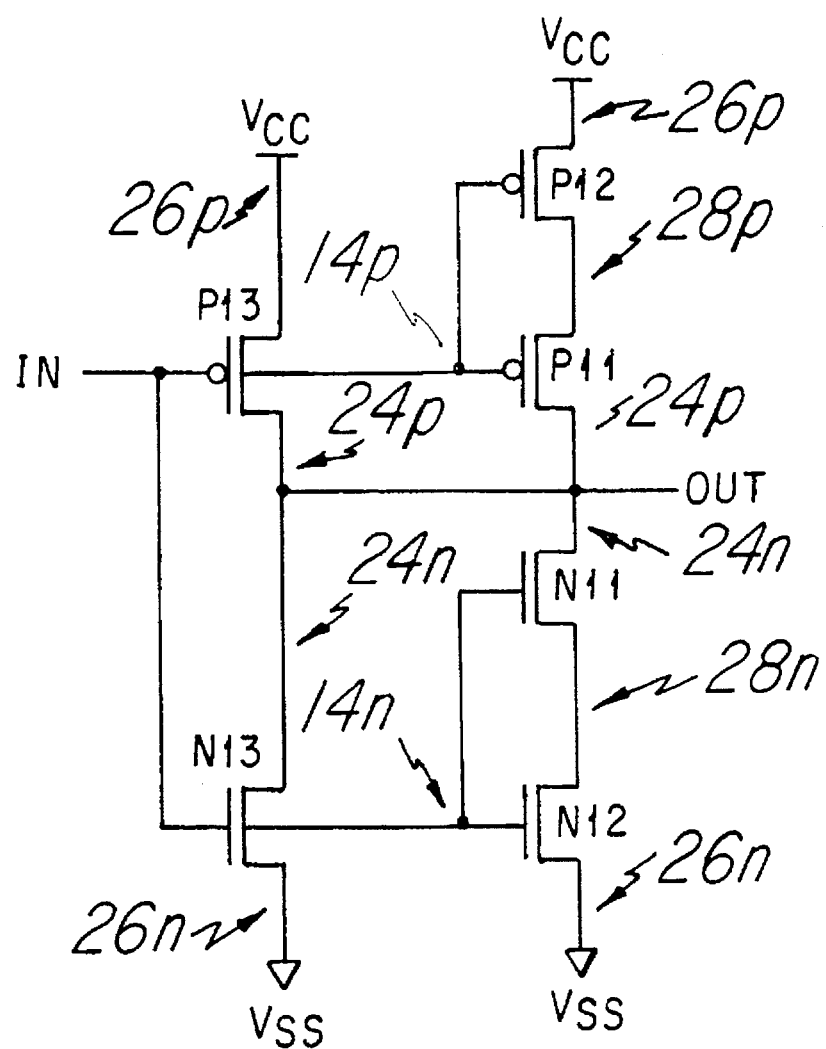
Figure 11C:
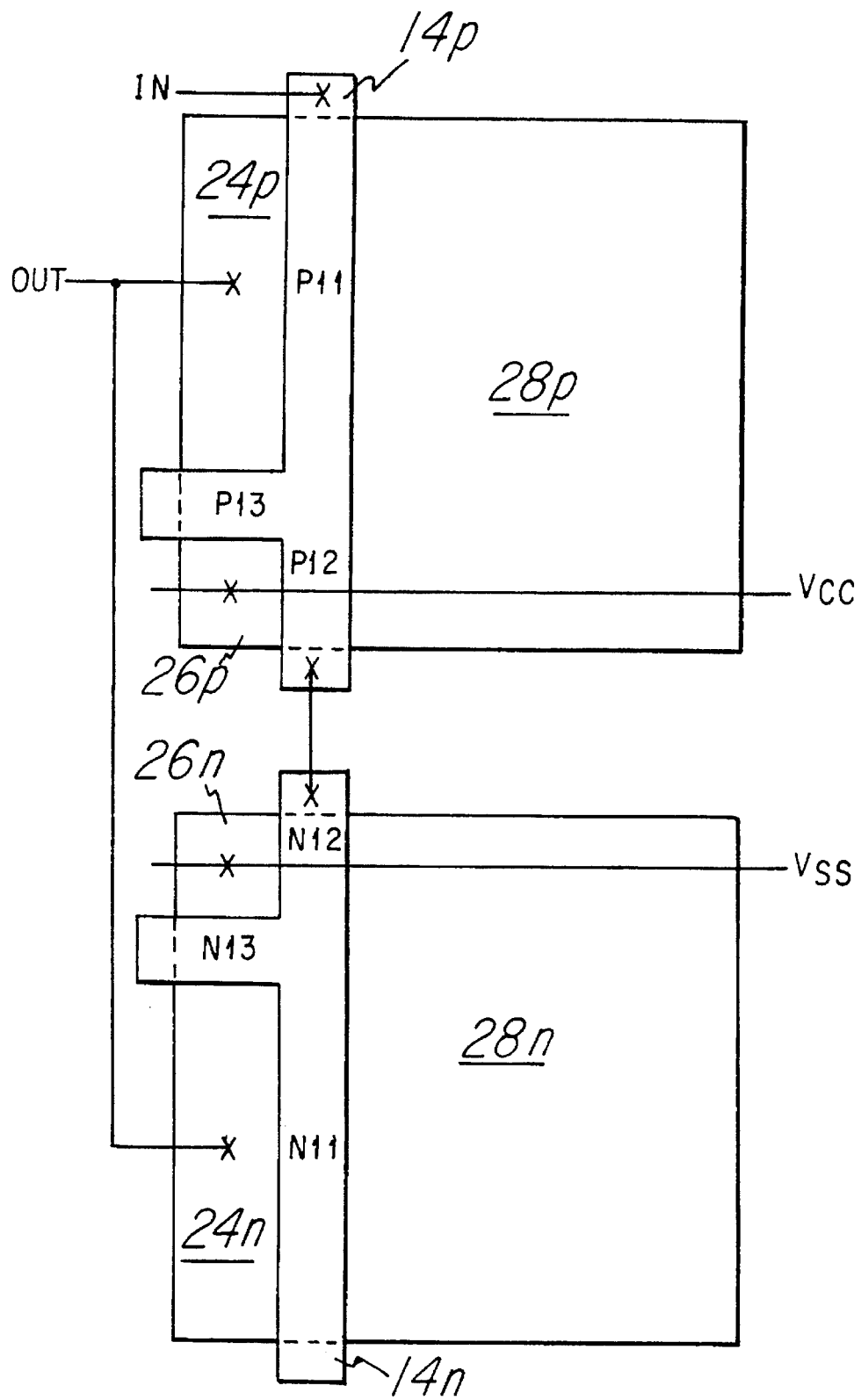

Referring to FIG. 11b along with FIG. 11c, the device utilizes a CMOS base cell such as the one described with reference to FIG. 4. Power supply voltage Vcc is applied to region 26p and power supply voltage Vss, which may be ground for example is connected to region 26n. The gates 14p and 14n are electrically connected to each other and coupled to the input IN. The output OUT is read at regions 24p and 24n, which are interconnected to each other. Once again, all interconnections may be formed from any of a large number of local interconnect techniques which are well known in the art.

The inverter 120 shown in FIG. 11 utilizes a low conductance transistor configuration such as the one illustrated in FIG. 8.

Figure 12A:
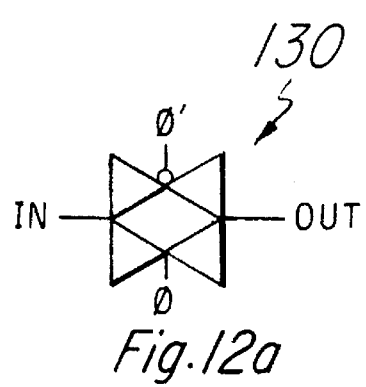
FIG. 12a–12c is a block, schematic, and layout of a transfer gate.

The next logic gate to be illustrated is a transfer gate 130 shown in functional block form in FIG. 12a. The transfer gate 130 also has an input signal IN and an output signal OUT as well as clock signals $\Phi$ and $\Phi'$. The schematic diagram and corresponding layout are shown in FIG. 12b and FIG. 12c, respectively.

Figure 12B:
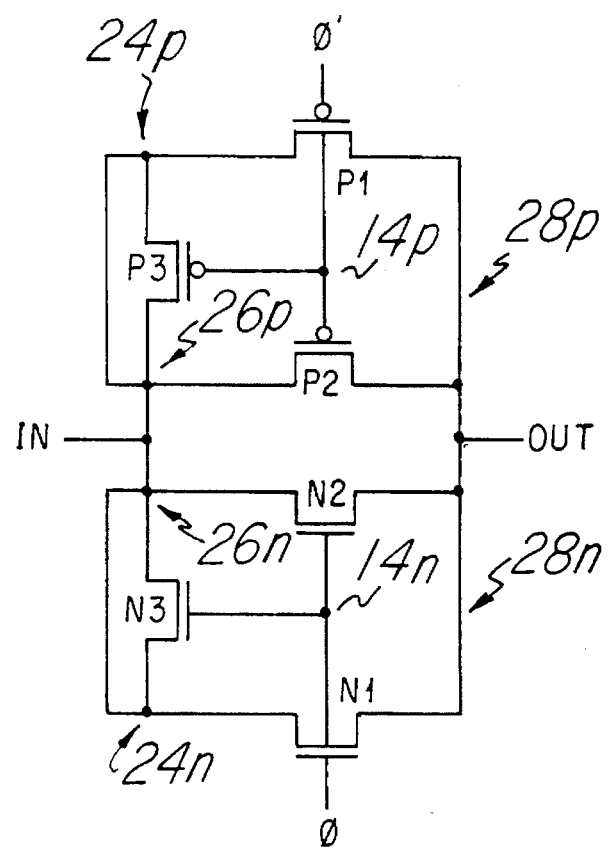
Figure 12C:
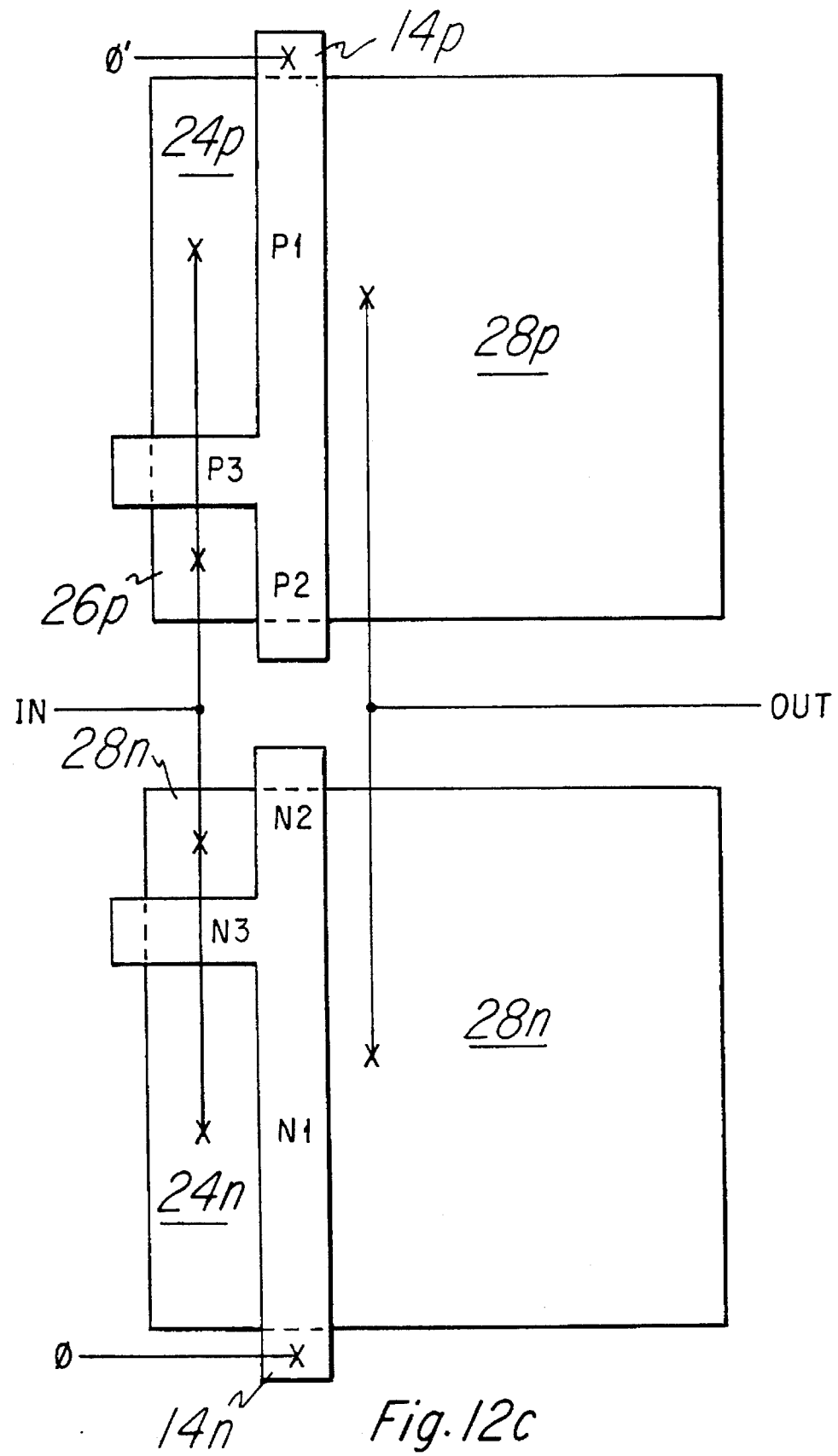

Referring to FIG. 12b along with FIG. 12c, the device utilizes a CMOS base cell such as the one described with reference to FIG. 4. The gate 14p is connected to clock signal $\Phi'$ and gate 14n is electrically connected to clock signal. The input IN is connected to interconnected regions 24p, 26p, 26n, and 24n. The output OUT is read at regions 28p and 28n, which are interconnected to each other. Once again, all interconnections may be formed from any of a large number of local interconnect techniques which are well known in the art.

The transfer gate 130 passes the value of input IN to output OUT whenever the clock signal $\Phi$ is high (and $\Phi'$ is low).

Each of the logic elements discussed with respect to FIGS. 10 through 12 use only one gate in each moat region. Therefore, two elements may be built from one dual gate base cell or a base cell pattern with only one gate per cell may be used.

Figure 13A:
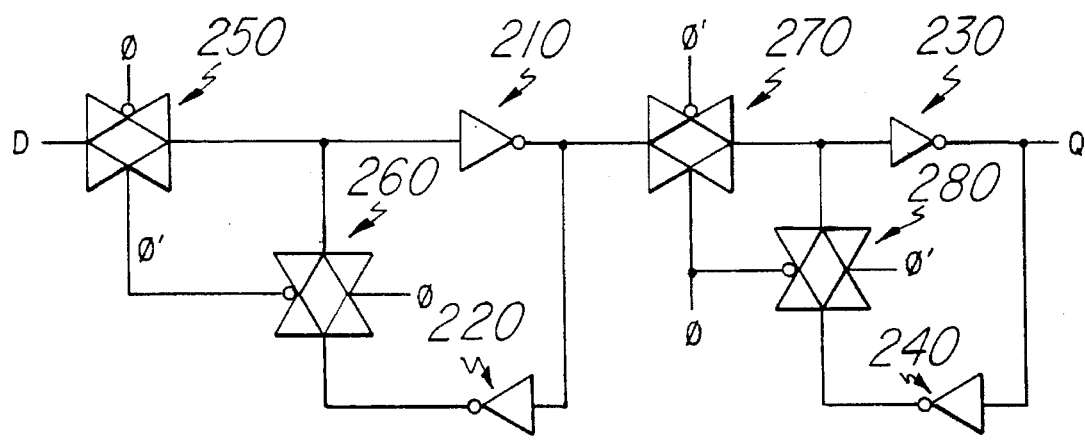
FIG. 13a is a block diagram of a prior art D flip-flop.

FIG. 13a illustrates a prior art D flip flop functional schematic diagram. The circuit uses four inverters and four enable elements. All four inverters have the same channel width and length since they there is only one transistor size available per base cell, as shown in FIG. 1. As a result, the enable element 260 is required to avoid a conflict between inverters 210 and 220 when the input Din changes levels. The same is true for element 280.

Figure 13B:
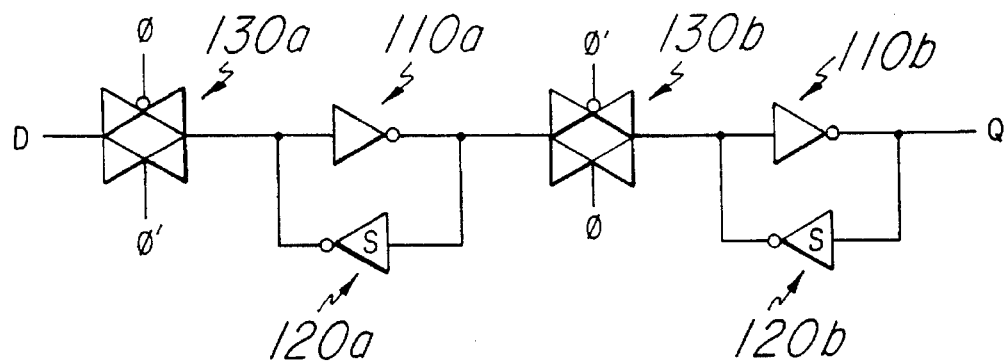
FIG. 13b is a block diagram of a D flip-flop built using a cell on the present invention.

FIG. 13b illustrates the functional schematic diagram of D flip-flop using the logic elements described with respect to FIGS. 10 through 12. In this circuit, only one enable element 130a is needed since the transistor 120a has a lower drive capability than the transistor 110a. The same is true for element 130a and transistors 110a and 120a.

The embodiment shown in FIG. 13b has several advantages over the prior art. Since less elements are required, the circuit will require less surface area. In addition, the clock signals $\Phi$ and $\Phi'$ need to drive only half the number of elements and therefore less power will be required.

Figure 14A:
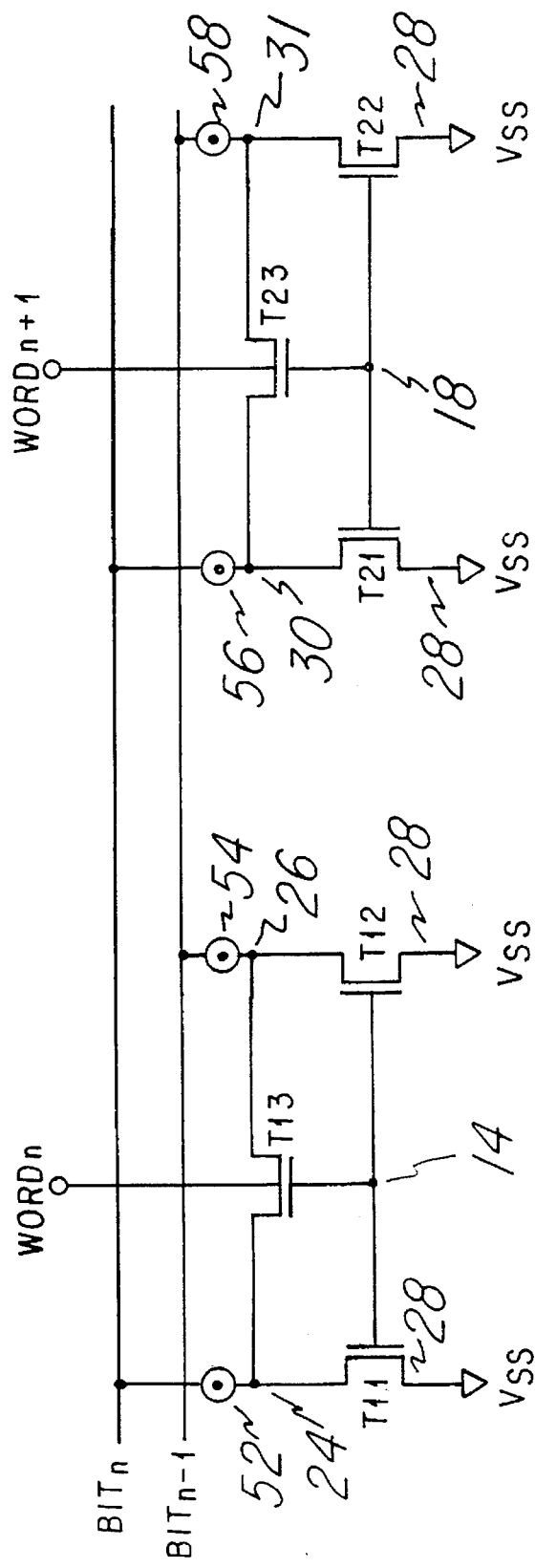
FIG. 14a–14b is a schematic and a layout of a 4-bit ROM cell.
Figure 14B:
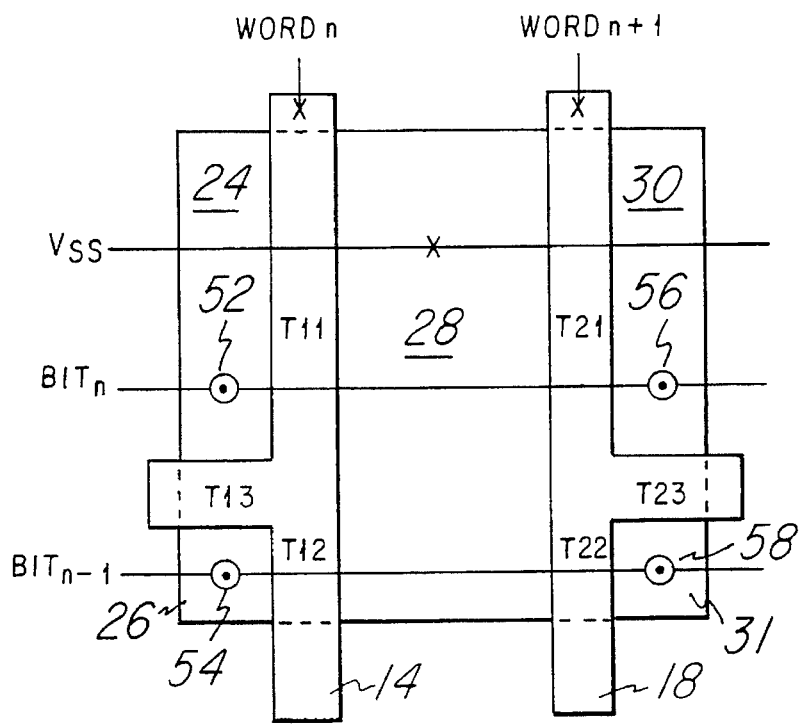

Referring next to FIG. 14a, the schematic diagram for a read only memory (ROM) is illustrated. A layout for the cell is shown in FIG. 14b. In this circuit, the two gates of the base cell provide four bits of ROM element. The schematic shows one dual transistor base cell with one gate extension such as the one shown in FIG. 2b or FIG. 2c, for example. Each half of the base cell is configured as shown in FIG. 6b.

In the sample ROM circuit shown, gate 14 is coupled to wordline Word$_n$ and gate 18 is coupled to word line Word$_{n+1}$. Voltage source Vss, which may be ground for example, is coupled to region 28 which is common to transistors T12, T11, T22 and T21. Programmable contact 52 is formed between bitline Bit$_n$ and region 24 of transistor T13 and T11 and likewise programmable contact 56 is formed between bitline Bit$_n$ and region 30 of transistor T23 and T21. In addition bitline Bit$_{n-1}$ is coupled to region 26 through programmable contact 54 and is also coupled to region 31 through programmable contact 58. The state of the programmable contact (either conducting or non-conducting) will determine if the cell is programmed to a logical "1" or a logical "0."

The ROM configuration illustrated in FIG. 14 has the advantage over prior art cells because there are twice as many bits per cell than previous gate array ROM circuits.

Figure 15A:
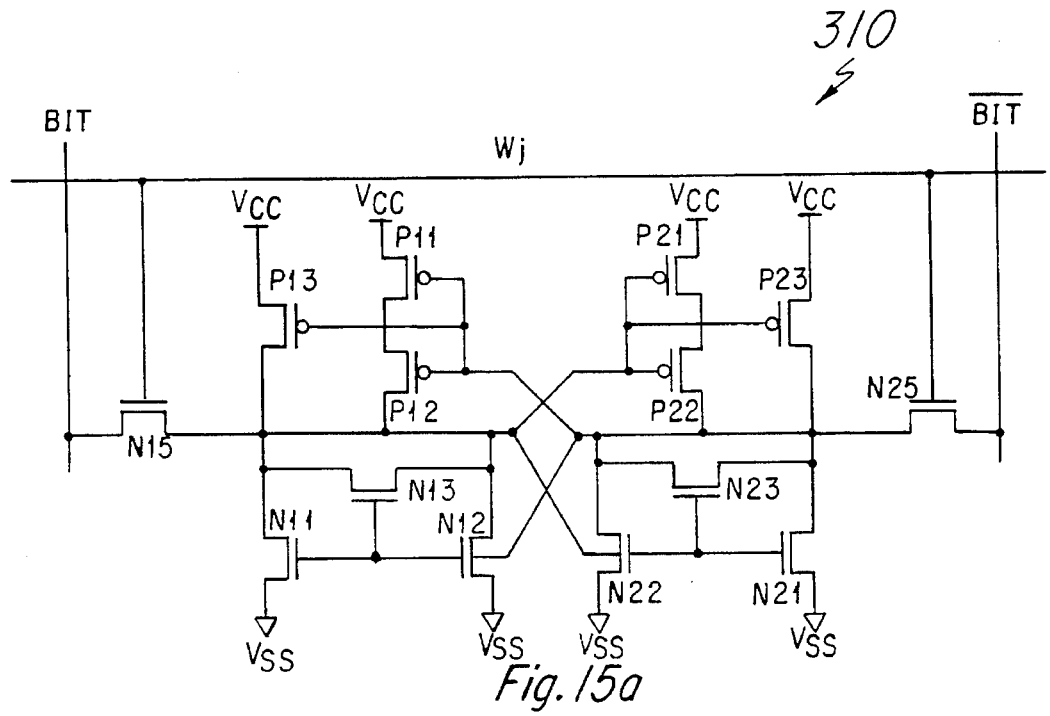
FIG. 15a–15b is a schematic diagram and layout of a SRAM cell.
Figure 15B:
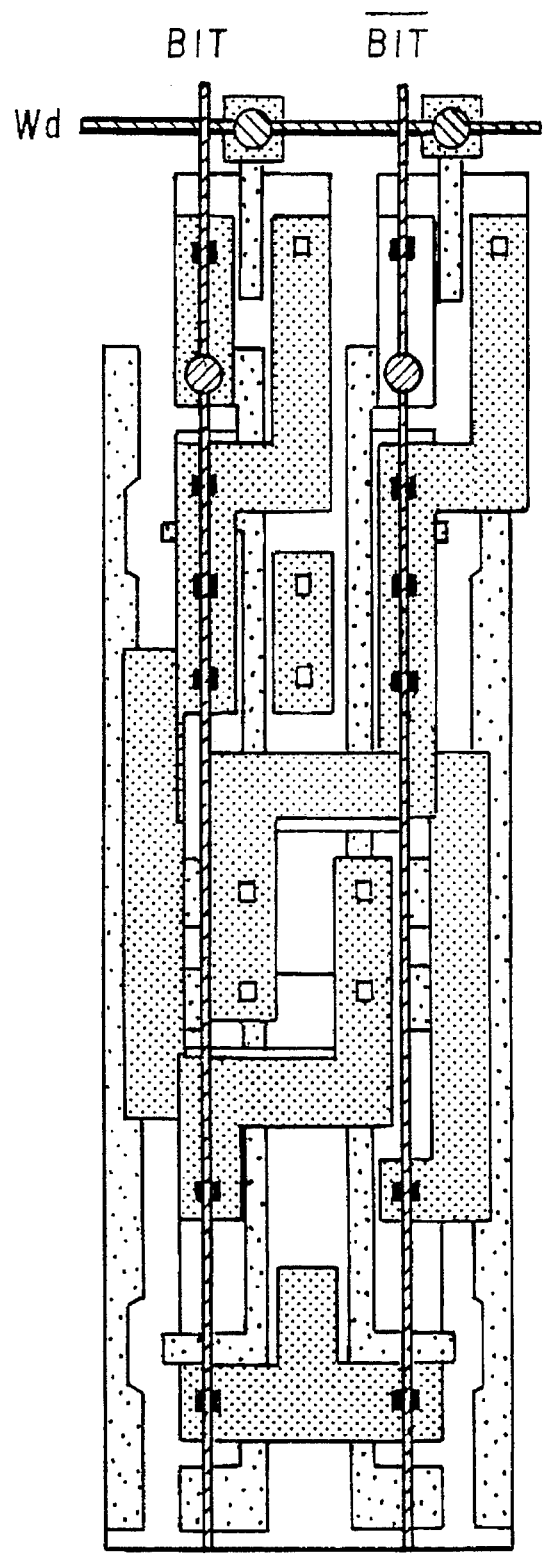

A static random access memory (SRAM) circuit using an embodiment of a transistor cell of the present invention is illustrated schematically in FIG. 15a and in layout form in FIG. 15b. The cell 310 shown utilizes a single CMOS base cell layout such as the one discussed with reference to FIG. 4.

Referring to FIG. 15a, the p-channel transistors are configured as shown above with respect to FIG. 8. The n-channel transistors are configured as shown in FIG. 6. Small moat transistors N15 and N25 serve as pass gate transistors and wordline Wd is coupled to the gates of transistor N15 and transistor N25. Bitline BIT is coupled to the source of transistor N15 and bitline BIT' is coupled to the drain of transistor N25. The sources of transistor N11, N12, N22 and N21 are coupled to voltage Vss which may be ground. The sources of transistor P13, P11, P21, and P23 are coupled to voltage Vcc.

In general, to maximize memory performance, a pass gate in an SRAM cell is designed to be small. A channel conductance of the p-channel gate in the memory cell should be small compared to the n-channel gate, otherwise a data "0" cannot be written into the memory cell properly. The cell shown in FIG. 15 has these properties.

Figure 16A:
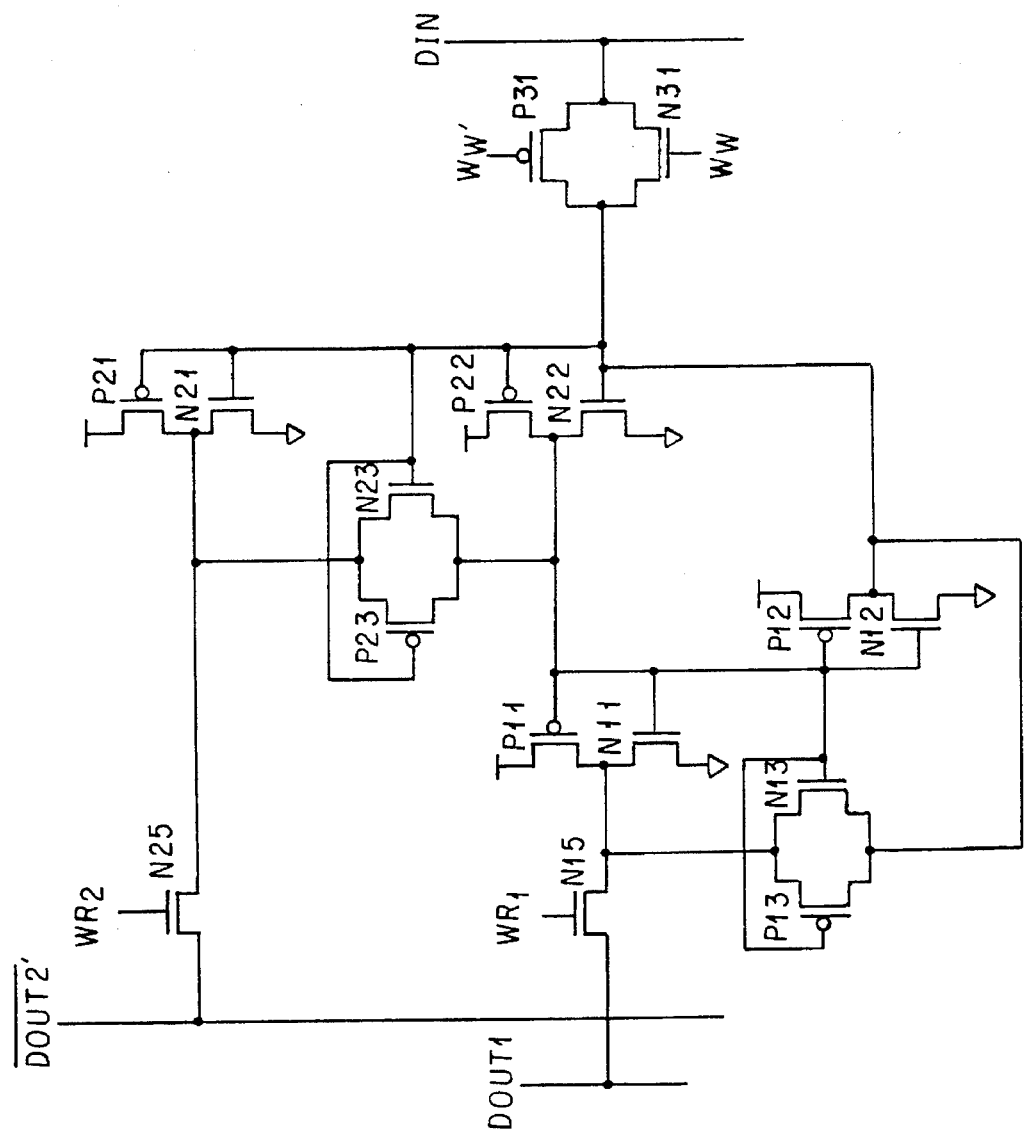
FIG. 16a–16b is a schematic diagram and layout of a multiport memory cell.
Figure 16B:
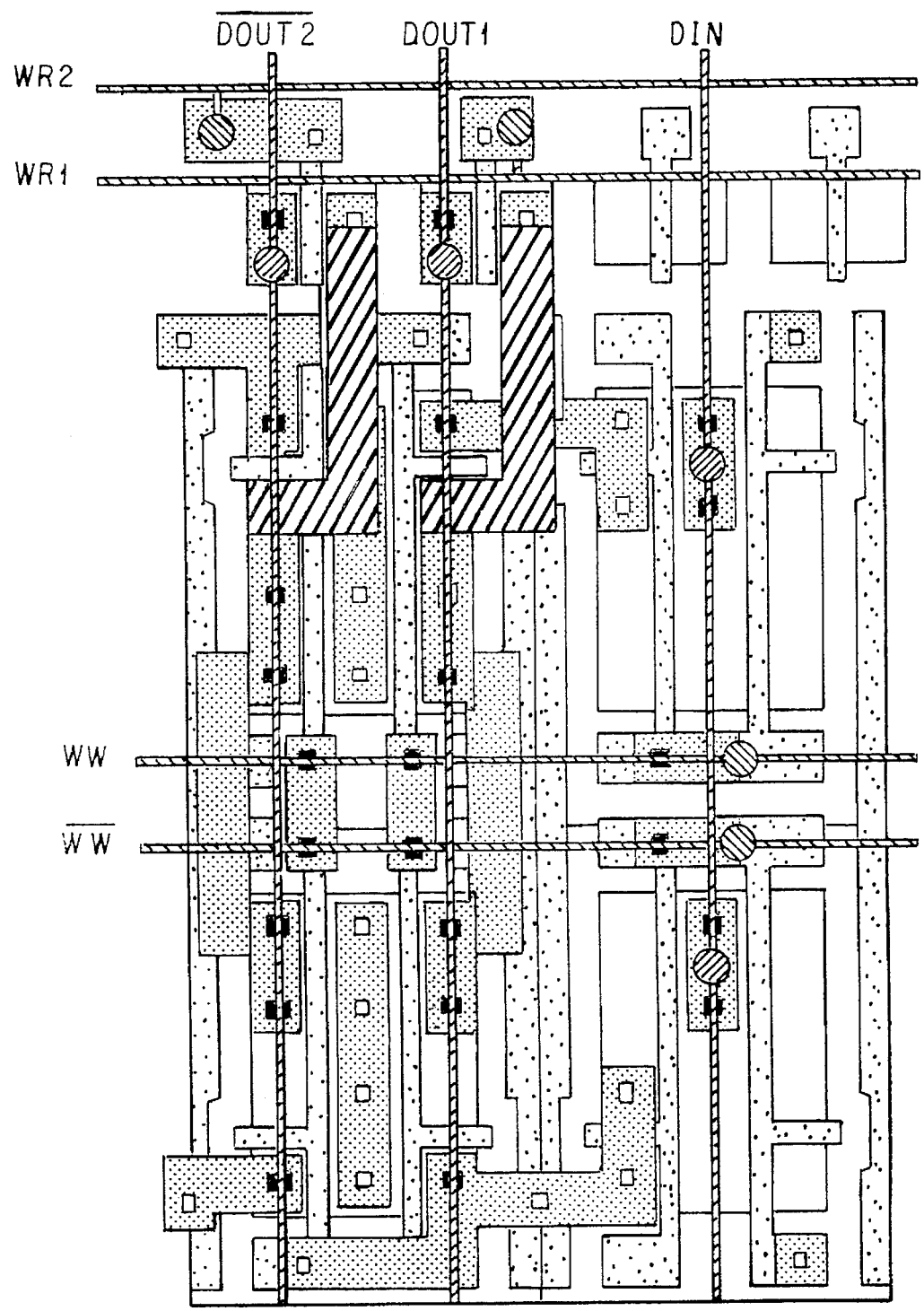

As a final example, a 1W2R (one write-two read) three port memory circuit is illustrated schematically in FIG. 16a and in layout form in FIG. 16b. The circuit utilizes one and a half CMOS base cells such as the one discussed with reference to FIG. 4.

Referring now to FIG. 16a, the multiport memory cell is built using transistor configurations such as those described with respect to FIG. 4. Voltage $D_{out1}$ is coupled to the source of transistor N15 and voltage $D_{out2}'$ is coupled to the source of transistor N25. Control signal $WR_2$ is coupled to the gate of transistor N25 and control signal $WR_1$ is coupled to the gate of transistor N 15. Voltage $D_{in}$ is coupled to the drain of transistors P31 and N31 while voltage $W_w$ is coupled to the gate of transistor N31 and voltage $W_w'$ is coupled to the gate of transistor P31. The interconnections are shown in layout form in FIG. 16b.

In general when building a multiport memory, many inverters are required for the individual read and write ports. For example, in the prior art three base cells, each of which include two transistors such as shown in FIG. 1b, may be required to build a 1W2R three port memory. The base cell of the preferred embodiment, however, requires only one and a half base cells to build the same function. The operation of the circuit shown in FIG. 16 is generally the same as prior art cells. Transistor P13, N13, P23, and N23 behave as high resistance feedback elements. The inverter formed by transistors P11 and N11 does not participate much in the operation of the inverter formed by transistors P12 and N12. Therefore, the data write operation can be accomplished without an additional switch. For the same reason, output noise at N15 and N25 will be well suppressed by the feedback resistance and as a result the memorized data will be securely preserved.

The following description is illustrative of one possible method to form the structure of the present invention. The fabrication method will be described with reference to the cross-sectional drawings of FIG. 17.

Figure 17A:
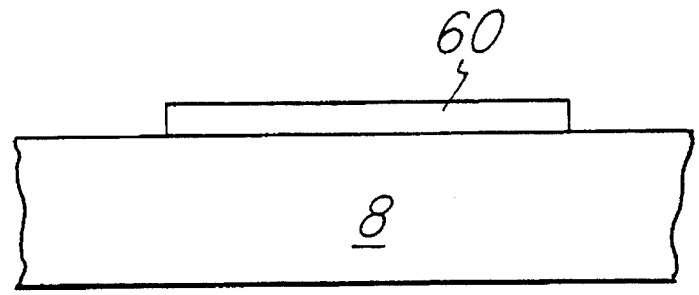
FIG. 17a–17e are cross-sectional views illustrative of one method of fabrication.

Referring to FIG. 17a, a semiconductor substrate 8 is provided. In a preferred embodiment, the substrate 8 comprises lightly doped p-type silicon. The substrate 8 may also be lightly doped n-type silicon. In the first step of the fabrication processed to be described, a masking layer 60, such as nitride for example, is deposited and etched to cover the active areas.

Figure 17B:
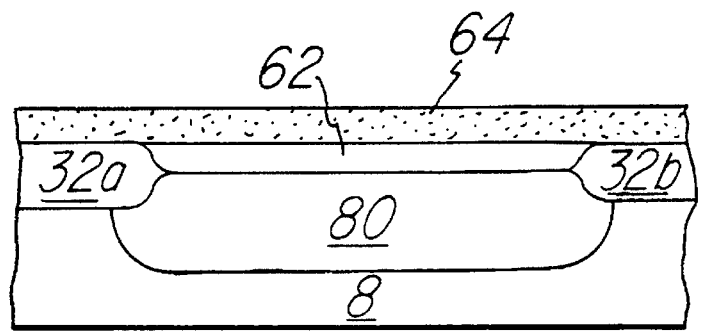

Referring now to FIG. 17b, an insulating region 32 is formed on the substrate surface where the masking layer 60 is not present. One method which may be used is to thermally grow an oxide layer and form a silicon dioxide isolation region 32. After forming the isolation region 32, the masking layer 60 is removed.

If a p- doped substrate 8 is used and a p-channel device is required, then the next step of the illustrative process is to form n-well 80. The n-well 80 is formed using well known doping techniques such as implantation or diffusion, as examples. If a CMOS gate array, such as the one shown in FIG. 4, is being formed, then some of the devices will be n-channel and the remaining devices p-channel. The figures illustrate a p-channel MOS fabrication step but it should be understood the CMOS fabrication can easily be accomplished with the inclusion of the cell which do not include n-well as described above. Of course, if only n-channel devices are required in the array, no n-wells will be included.

Gate insulating layer 62 is formed in the active areas. The insulating layers typically comprise an oxide, for example. This oxide may be deposited, for example. Conducting layer 64 is then formed over the gate insulating layer 62. Conducting 15 layer 64 typically comprises highly doped polysilicon, for example.

Figure 17C:
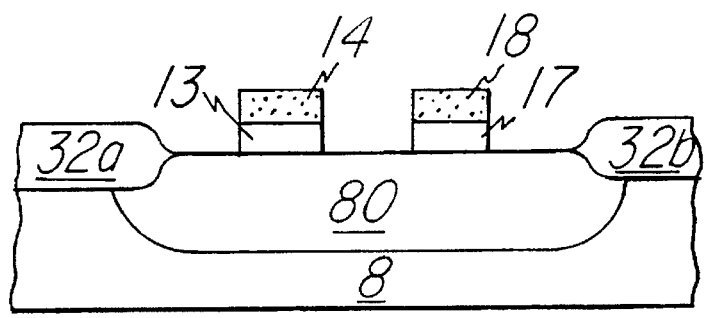

Referring next to FIG. 17c, conductive gate layer 64 and gate insulating layer 62 are patterned and etched to form gate 14 and gate 18 as well as gate insulating layer 13 and 17. Of course, the gate extensions, not shown, are also created during this step. The gates are created using well known process steps to create the gate design of choice as described with reference to FIGS. 2 through 5.

Figure 17D:
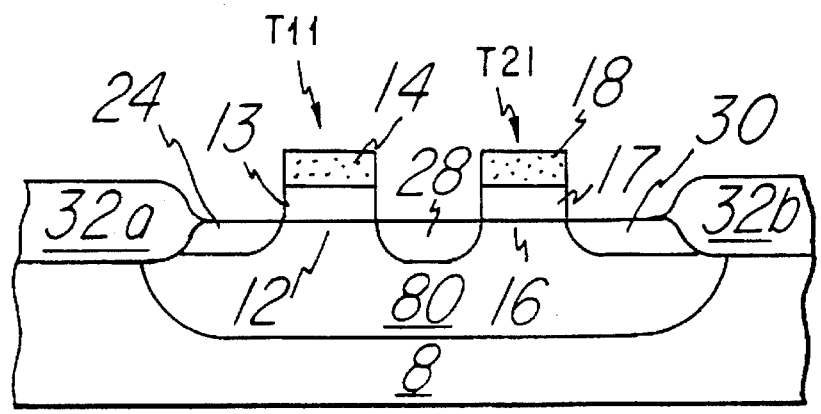

The moat regions 24, 28, and 30 are then doped as illustrated in FIG. 17d. The doping process can be performed by ion implantation or by one of the other well known doping techniques such as diffusion, for example. An annealing step is often performed after doping the moat region. The conductivity type of the dopant in the moat region determines the conductivity of the device, ie., n-channel or p-channel. As discussed previously, the doping type of the channel 12 and 16 is typically, but not necessarily, different than that of the moat regions 24, 28, and 30.

The cross-sectional view shown in FIG. 17d is a view of the structure illustrated in FIG. 2b or FIG. 2c along the DD line. As illustrated, channel region 12 along with source region 24 and drain region 28 and gate 14 form transistor T11 and likewise channel region 16 along with source region 28 and drain region 30 and gate 18 form transistor T21. An analogous process flow is used to form the other embodiments described herein.

The next step of the illustrative process flow is the deposition of insulating layer 50 over the entire surface of the base cell 10 and the other base cells on the chip. Insulating layer 50 may be formed from a deposited oxide or nitride, for example. Since the base cell pattern is the same for many different application, the cells may be fabricated prior to the design or production of the actual circuit. Insulating layer 50 will protect the device during storage periods if the device is in fact prefabricated.

Figure 17E:
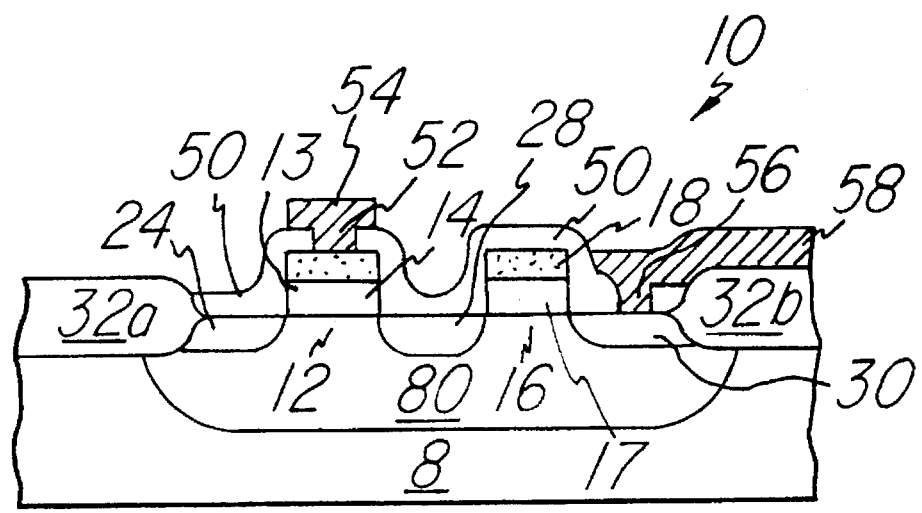

To form the connections required for the desired circuit, a hole is formed in insulating layer 50 and a contact is formed. FIG. 17e illustrates contact 52 and contact 58 as examples. One method to form the contact is by etching layer 50 and creating a metallic plug 52 (or 58), as is well known in the art. The metallic plug 52 (or 58) may comprise tungsten for example.

Interconnect lines 54 and 58 are then formed and etched to create the desired connections as previously discussed. The interconnect lines 54 and 58 may be formed from a metal such as tungsten or titanium or aluminum. Although not shown, as is well known in the art, a multilevel interconnect scheme may be implemented by forming an additional insulating layer and forming additional interconnect lines.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A base cell within an array of base cells, each of said base cells comprising:
    a moat region of a first conductivity type formed in a semiconductor substrate;
    a continuous channel region of a second conductivity type, said second conductivity type different than said first conductivity type, said channel region separating said moat region into at least three separate source/drain regions wherein the extent of the junction between said channel region and said first source/drain region is larger than the extent of the junction between said channel region and said second source/drain region:
    an insulating layer formed above said channel region; and
    a gate formed above said insulating layer;
    wherein said region of first conductivity type in about half of said base cells comprises n doped silicon and wherein said region of first conductivity type in the remaining base cells comprises p doped silicon.

2. The array of claim 1 and further comprising a second insulating layer formed over said base cells.

3. The array of claim 2 and further comprising a plurality of conductive paths contacting said base cells through said second insulating layer to form a transistor circuit.

4. The array of claim 3 wherein said conductive paths comprise metal interconnects.

5. The array of claim 3 wherein said transistor circuit includes a plurality of high conductivity channel field effect transistor devices.

6. The array of claim 3 wherein said transistor circuit includes a plurality of low conductivity channel field effect transistor devices.

7. The array of claim 3 wherein said transistor circuit includes a plurality of memory cells.

8. The array of claim 1 wherein said moat region is separated into exactly three regions.

9. The array of claim 1 wherein said gate comprises polysilicon.

10. A semiconductor structure comprising:
    an active area formed in the face of a semiconductor workpiece;
    at least three separate source/drain regions in said active area, said at least three source/drain regions separated by a continuous channel region wherein said at least three source/drain regions comprise a first source/drain region, a second source/drain region, and a third source/drain region wherein said first source/drain region is larger than said second source/drain region and wherein said second source/drain region is larger than said third source/drain region; and
    a conductive gate insulatively overlying said channel region.

11. The structure of claim 10 and further comprising a fourth source/drain region, said fourth source/drain region separated from at least one of said three source drain regions by said continuous channel region.

12. An array of base cells, each of said cells comprising:
    a substantially rectangular region of a first conductivity type formed in a semiconductor substrate;
    a continuous channel region of a second conductivity type, said second conductivity type different than said first conductivity type, said channel region separating said moat region into exactly three separate source/drain regions;
    an insulating layer formed above said channel region; and
    a gate formed above said insulating layer; and
    an insulating region formed between said base cells.

13. A base cell within an array of base cells, said base cell comprising:
    a substantially rectangular moat region of a first conductivity type formed in a semiconductor substrate;
    a continuous channel region of a second conductivity type, said second conductivity type different than said first conductivity type, said channel region separating said moat region into at least three separate source/drain regions wherein the extent of the junction between said channel region and said first source/drain region is larger than the extent of the junction between said channel region and said second source/drain region;
    an insulating layer formed above said channel region; and
    a gate formed above said insulating layer.

14. A gate array base cell comprising a p-moat region including first, second, third, fourth and fifth p-regions and an n-moat region wherein:
    said first and second p-regions comprise the source and drain of a first p-channel transistor, said first p-channel transistor including a first gate;
    said first and third p-regions comprise the source and drain of a second p-channel transistor, said second p-channel transistor including said first gate;
    said first and fourth p-regions comprise the source and drain of a third p-channel transistor, said third p-channel transistor including a second gate; and
    said first and fifth p-regions comprise the source and drain of a fourth p-channel transistor, said fourth p-channel transistor including said second gate.

15. The cell of claim 14 wherein:
    said first and third p-channel transistors have a selected channel width; and
    said second and fourth p-channel transistors have a channel width different than said selected channel width.

16. The cell of claim 15 wherein:
    said second and third p-regions comprise the source and drain of a fifth p-channel transistor; and
    said fourth and fifth p-regions comprise the source and drain of a sixth p-channel transistor.

17. The cell of claim 16 wherein:

said first, second and third p-regions are separated by a first continuous channel region, said first continuous channel region underlying said first gate; and said first, fourth and fifth p-regions are separated by a second continuous channel region, said second continuous channel region underlying said second gate.

18. An array of substantially identical gate array base cells, each base cell including:

a p-channel transistor section, said p-channel transistor section including at least three p-doped source/drain regions, said at least three p-doped source/drain regions configurable to comprise source/drain regions of at least two different size PMOS transistors; and an n-channel transistor section, said n-channel transistor section including at least two n-doped source/drain regions, said at least two n-doped source/drain regions configurable to comprise source/drain regions of an NMOS transistor.

19. The array of claim 18 wherein each of said p-channel transistor sections comprises at least three p-doped source/drain regions separated by a continuous channel region.

20. A CMOS gate array base cell comprising:

a p-channel transistor section comprising a first PMOS transistor which includes first and second source/drain regions separated by a first channel region, said p-channel transistor section also comprising a second PMOS transistor which includes third and fourth source/drain regions separated by a second channel region, said first and second PMOS transistors having different channel conductivities; and an n-channel transistor section comprising an NMOS transistor which includes at least two n-doped source/drain regions separated by an n-channel region.

21. The base cell of claim 20 wherein said first and third source/drain regions comprise a single doped region such that said first and second PMOS transistors share a common source/drain region.

22. The base cell of claim 21 wherein said first channel region and said second channel region form a single continuous channel region.

23. The base cell of claim 22 wherein said single continuous channel region further separates said second source/drain region from said fourth source/drain region.

24. The base cell of claim 20 wherein said p-channel transistor section further comprises:

a third PMOS transistor which includes said first source/drain region and a fifth source/drain region, said first and fifth source/drain regions separated by a third channel region;

a fourth PMOS transistor which includes said third source/drain region and a sixth source/drain region, said third and sixth source/drain regions separated by a fourth channel region.

25. The base cell of claim 24 wherein said first and third source/drain regions comprise a single doped region such that said first, second, third and fourth PMOS transistors share a common source/drain region.

26. The base cell of claim 25 wherein said first channel region and said second channel region form a first single continuous channel region and said third channel region and said fourth channel region form a second single continuous channel region.

27. The base cell of claim 26 wherein said first single continuous channel region further separates said second source/drain region from said fourth source/drain region and wherein said second single continuous channel region further separates said fifth source/drain region from said sixth source/drain region.

28. The base cell of claim 24 and further comprising a first gate which overlies said first and second channel regions and a second gate which overlies said third and fourth channel regions.

29. The base cell of claim 20 and further comprising a gate which overlies said first and second channel regions.

30. A CMOS gate array base cell comprising:

a first transistor section comprising a first and second transistors of a first conductivity type, said first transistor including first and second source/drain regions separated by a first channel region, and said second transistor including third and fourth source/drain regions separated by a second channel region, said first and second transistors having different channel conductivities; and a second transistor section comprising at least one transistor of a second conductivity type, said second conductivity type being different than said first conductivity type.

31. The CMOS gate array base cell of claim 30 wherein said first and second transistors of a first conductivity type comprise p-channel transistors and wherein said at least one transistor of a second conductivity type comprises an n-channel transistor.

32. The CMOS gate array base cell of claim 30 wherein said first and second transistors of a first conductivity type comprise n-channel transistors and wherein said at least one transistor of a second conductivity type comprises an p-channel transistor.

33. A semiconductor structure comprising:

an active area formed in the face of a semiconductor workpiece;

two continuous channel regions disposed in said active area, said two continuous channel regions dividing said active area into exactly five separate source/drain regions; and a conductive gate insulatively overlying each of said channel regions.

34. A gate array base cell, comprising:

a first pair of P-channel transistors having a first predetermined transconductance area;

a second pair of P-channel transistors having a second predetermined transconductance area, said second predetermined transconductance area being smaller than said first predetermined transconductance area; and a first pair of N-channel transistors, a first one of said first pair of N-channel transistors having a gate coupled to a gate of a first one of said first pair of P-channel transistors and to a gate of a first one of said second pair of P-channel transistors, a second one of said first pair of N-channel transistors having a gate coupled to a gate of a second one of said first pair of P-channel transistors and to a gate of a second one of said second pair of P-channel transistors.

35. The base cell of claim 34 and further comprising a pair of select transistors.

36. The base cell of claim 34 in which each of said first pair of P-channel transistors and said second pair of P-channel transistors has a first source/drain region, said first source/drain region being coupled in common.

* * * * *